(12) United States Patent
Kanai

(10) Patent No.: US 6,900,514 B2
(45) Date of Patent: May 31, 2005

(54) SEMICONDUCTOR DEVICE HAVING A CAPACITANCE DEVICE

(75) Inventor: Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/193,066

(22) Filed: Jul. 12, 2002

(65) Prior Publication Data

US 2003/0025149 A1 Feb. 6, 2003

(30) Foreign Application Priority Data

Jul. 31, 2001  (JP) ........................................ 2001-231640

(51) Int. Cl.$^7$ .............................................. H01L 29/00
(52) U.S. Cl. ..................... 257/516; 257/532; 257/535
(58) Field of Search ................... 257/315–317, 257/319–321, 324, 516, 532, 534, 535, 303, 306; 438/253, 254, 238, 239

(56) References Cited

U.S. PATENT DOCUMENTS

| | | |
|---|---|---|
| 5,408,115 A | 4/1995 | Chang |
| 5,422,504 A | 6/1995 | Chang et al. |
| 5,494,838 A | 2/1996 | Chang et al. |
| 5,969,383 A | 10/1999 | Chang et al. |
| 6,177,318 B1 | 1/2001 | Ogura et al. |
| 6,211,008 B1 * | 4/2001 | Yu et al. ..................... 438/253 |
| 6,248,633 B1 | 6/2001 | Ogura et al. |
| 6,255,166 B1 | 7/2001 | Ogura et al. |
| 6,445,028 B1 * | 9/2002 | Yoshida et al. ............. 257/306 |
| 6,600,190 B2 * | 7/2003 | Lowrey et al. ............. 257/306 |

FOREIGN PATENT DOCUMENTS

| | | |
|---|---|---|
| JP | A 7-161851 | 6/1995 |
| JP | B1 2978477 | 9/1999 |
| JP | A 2001-156188 | 6/2001 |

OTHER PUBLICATIONS

Hayashi et al., "Twin MONOS Cell with Dual Control Gates", VLSI Technology Digest of Technical Papers, 2000.
Chang et al., "A New SONOS Memory Using Source–Side Injection for Programming", IEEE Electron Device Letters, vol. 19, No. 7, Jul. 1998, pp. 253–255.
Chen et al., "A Novel Flash Memory Device with S P/it Gate Source Injection and ONO Charge Storage Stack (SPIN)", VLSI Technology Digest of Technical Papers, 1997, pp. 63–64.
New U.S. Patent Application, Jul.12, 2002, Kanai.

* cited by examiner

Primary Examiner—Thien F Tran
(74) Attorney, Agent, or Firm—Oliff & Berridge, PLC

(57) ABSTRACT

A semiconductor device having an isolation region formed in a semiconductor substrate and a capacitance device formed above that isolation region. The capacitance device has a first capacitor conductive layer disposed above the isolation region and a second capacitor conductive layer in the shape of a side wall formed along one side surface of the first capacitor conductive layer. The second capacitor conductive layer is disposed facing the first capacitor conductive layer, with a first capacitor insulating layer interposed.

29 Claims, 17 Drawing Sheets

SEMICONDUCTOR DEVICE HAVING A CAPACITANCE DEVICE

Japanese Patent Application No. 2001-231640, filed on Jul. 31, 2001, is hereby incorporated by reference in its entirety.

BACKGROUND OF THE INVENTION

The present invention relates to a novel semiconductor device having a capacitance device.

One type of non-volatile memory cell is a metal-oxide-nitride-oxide substrate (MONOS), wherein a gate insulating layer between the channel and the gate is formed of a multi-layer stack of a silicon oxide layer and a silicon nitride layer, and charge is trapped in the silicon nitride layer.

A device shown in FIG. 17 is known as an example of this MONOS type of non-volatile memory cell (disclosed by Y. Hayashi, et al, in 2000 *Symposium on VLSI Technology Digest of Technical Papers*, pp. 122–123).

In this MONOS memory cell 102, a word gate 14 is formed on a semiconductor substrate 10 with a first gate insulating layer 12 therebetween. A first control gate 20 and a second control gate 30 are formed on either side of the word gate 14, in the shape of side walls. There is a second gate insulating layer 22 between a base portion of the first control gate 20 and the semiconductor substrate 10, and an insulating layer 24 between a side surface of the first control gate 20 and the word gate 14. In a similar manner, there is a second gate insulating layer 32 between a base portion of the second control gate 30 and the semiconductor substrate 10, and an insulating layer 34 between a side surface of the second control gate 30 and the word gate 14. An impurity layer 16 or 18, which is to form a source region or drain region, is formed in the semiconductor substrate 10 between the opposing control gates 20 and 30 of neighboring memory cells.

In this manner, each memory cell 102 has two MONOS memory elements on the side surfaces of the word gate 14. These two MONOS memory elements can be controlled independently, and thus the memory cell 102 can store two bits of information.

The operation of these MONOS memory elements is as described below. Each control gate of the memory cell 102 can be selected independently for writing and reading by biasing the other control gate by an overwrite voltage.

The description now concerns writing (programming), using a case in which electrons are implanted into a second gate insulating layer (ONO film) 32 on the left side of CG[i+1], as shown in FIG. 17. In this case, the bit line (impurity layer) 18 (D[i+1]) is biased by a drain voltage of 4 to 5 V. Since the control gate 30 (CG[i+1]) causes implantation of hot electrons into the second gate insulating layer 32 on the left side of the control gate 30 (CG[i+1]), it is biased to 5 to 7 V. Since the write current in the word line connected to the word gates 14 (Gw[i] and Gw[i+1]) is limited to a predetermined value (up to 10 $\mu$A), the word line is biased to a high voltage that is less than the threshold voltage of the word gate. The control gate 20 (CG[i]) is biased by an overwrite voltage. This overwrite voltage makes it possible to make a channel below the control gate 20 (CG[i]) conductive, regardless of the storage state. The bit line 16 (D[i]) on the left side is biased to the ground potential. The control gates and impurity layers of the other, non-selected memory cells are set to the ground potential.

For erasure, the accumulated charge (electrons) are erased by the implantation of hot holes. The hot holes can be generated by B—B tunneling in the surface of the bit impurity layer 18. During this time, the voltage Vcg of the control gates is negative (−5 to −6 V) so the voltage of the bit impurity layer is biased to 5 to 6 V.

This document discloses how the above described MONOS type of memory cell has two programming sites within one memory cell that can be controlled independently, to enable a bit density of $3F^2$.

As memory cells become smaller, there is a requirement for a reduction in size of capacitance devices comprised within an analog IC of the peripheral circuit section of such a memory cell.

BRIEF SUMMARY OF THE INVENTION

The present invention may provide a semiconductor device having a capacitance device wherein a reduction in size can be achieved thereby.

According to one aspect of the present invention, there is provided a semiconductor device comprising an isolation region formed in a semiconductor layer and a capacitance device formed above the isolation region, wherein the capacitance device includes:

a first capacitor conductive layer disposed above the isolation region; and a second capacitor conductive layer in the shape of a side wall, formed along one side surface of the first capacitor conductive layer; and wherein the second capacitor conductive layer is disposed facing the first capacitor conductive layer, with a first capacitor insulating layer interposed.

In this case, the surface area of a section through this second capacitor conductive layer in a plane parallel to the isolation region is smaller as the distance from the isolation region increases.

The semiconductor device in accordance with the present invention enables a reduction in size required for this capacitance device and also makes it possible to ensure a predetermined capacitance.

The semiconductor device in accordance with the present invention could have the various states described below.

(A) The first capacitor insulating layer may be formed between the first and second capacitor conductive layers.

(B) The second capacitor conductive layer may be disposed facing the isolation region, with a second capacitor insulating layer interposed.

(C) The first capacitor conductive layer may be disposed above the isolation region with a third capacitor insulating layer interposed.

(D) Each of the first and second capacitor insulating layers may be formed of a stack of a first silicon oxide layer, a silicon nitride layer, and a second silicon oxide layer.

(E) The second capacitor conductive layer may be covered by an insulating layer.

(F) The semiconductor device may have a plurality of the capacitance devices, and the first and second capacitor conductive layers in each of the capacitance devices may be arranged in a first direction and also extend in a second direction.

(G) The semiconductor device may include a first contact section connected to the capacitance device.

In that case, the semi conductor device may have a plurality of these second capacitor conductive layers; the capacitance device may include two of the second capacitor conductive layers; and the first contact section may be connected to the two of the second capacitor conductive layers.

The first contact section may include a first contact conductive layer and a pad-shaped second contact conductive layer disposed above the first contact conductive layer.

In that case, the first contact conductive layer may have a depression, and an insulating layer may be embedded within the depression.

In addition, the first contact section may further include a third contact conductive layer; and the first contact conductive layer may be disposed on an inner side of the third contact conductive layer, with a first side insulating layer interposed.

Furthermore, the semiconductor device may have a plurality of the capacitance devices and a plurality of first contact sections; the capacitance devices may be respectively connected to the first contact sections; and the plurality of the capacitance devices are connected to the second contact conductive layer.

(H) The semiconductor device may include a second contact section connected to the capacitance device; the second contact section may have a fourth contact conductive layer and a fifth contact conductive layer; the fourth contact conductive layer may be connected to the first capacitor conductive layer; and the fifth contact conductive layer may be connected to the second capacitor conductive layer.

In that case, the fourth contact conductive layer may be formed above the first capacitor conductive layer.

Moreover, the fourth contact conductive layer maybe formed of the same material as the second contact conductive layer.

In addition, the semiconductor device may have a plurality of the second capacitor conductive layers; the capacitance device may include two of the second capacitor conductive layers; and the two of the second capacitor conductive layers maybe connected to each other by the first contact conductive layer on one end and by the fifth contact conductive layer on the other end, to form a looped structure.

The semiconductor device may have a plurality of the capacitance devices and a plurality of the second contact sections; the capacitance devices maybe respectively connected to the second contact sections; and the fourth contact conductive layer in the second contact section may have an elongated shape.

(I) A contact region formed of a doped layer may be further provided in the semiconductor layer; and the contact region may be disposed around the isolation region.

In that case, the contact region may be connected to a reference power voltage.

(J) The semiconductor device may include a memory cell array in which non-volatile memory cells are arranged in a matrix of rows and columns, wherein each of the non-volatile memory cells may include: a word gate provided above the semiconductor layer with a first gate insulating layer interposed; an impurity layer formed in the semiconductor layer, to configure a source region or drain region; and first and second control gates in the shape of side walls, provided along one side surface and another side surface of the word gate, respectively;

wherein the first control gate may be disposed facing the semiconductor layer with a second gate insulating layer interposed, and also facing the word gate with a second side insulating layer interposed; and wherein the second control gate may be disposed facing the semiconductor layer with the second gate insulating layer interposed, and also facing the word gate with the second side insulating layer interposed.

In such a case, the semiconductor device could have the various states described below.

(a) The first and second control gates may have the same shape as the second capacitor conductive layer, and be also formed of the same material as the second capacitor conductive layer.

(b) The word gate may be formed of the same material as the first capacitor conductive layer.

(c) The second gate insulating layer and the second side insulating layer may be formed of the same material as the first capacitor insulating layer and the second capacitor insulating layer.

(d) The semiconductor device may further include a word line connected to the word gate, and the word line may be formed of the same material as the second contact conductive layer.

In such a case, the word line may be formed of the same material as the fourth contact conductive layer.

(e) The word gate may be formed of the same material as the third contact conductive layer.

DETAILED DESCRIPTION OF THE EMBODIMENT

Figure 1:
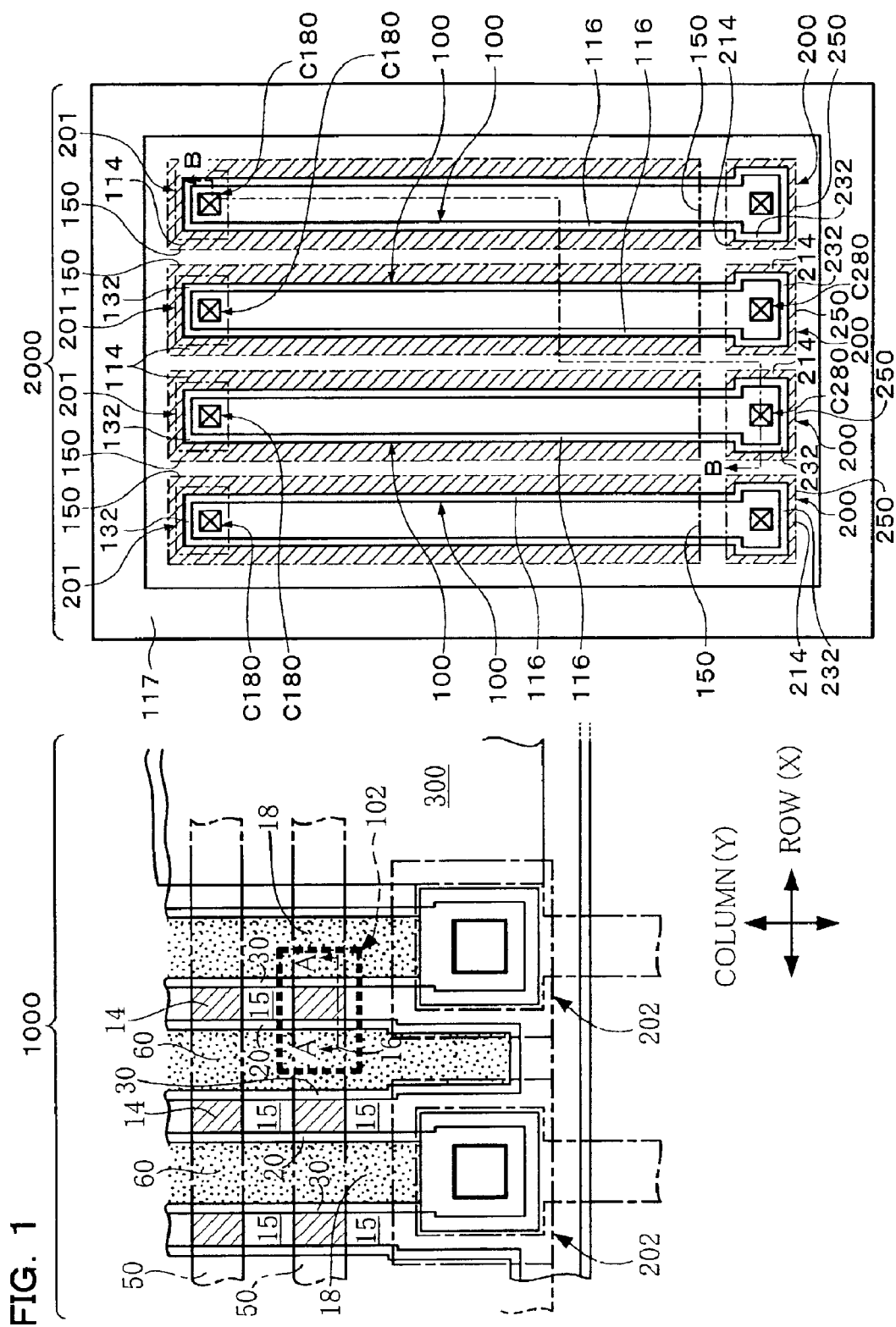
FIG. 1 is a schematic plan view showing the layout of the semiconductor device according to the embodiment of the present invention.

The layout of a semiconductor device in accordance with an embodiment of the present invention is shown schematically in plan view in FIG. 1. The layout of a memory cell array 1000 that forms the semiconductor device of this embodiment of the present invention is shown schematically in plan view in FIG. 2. Sections taken along the lines A—A and B—B in FIG. 1 are shown schematically in FIG. 3.

1. Configuration of Semiconductor Device

Figure 2:
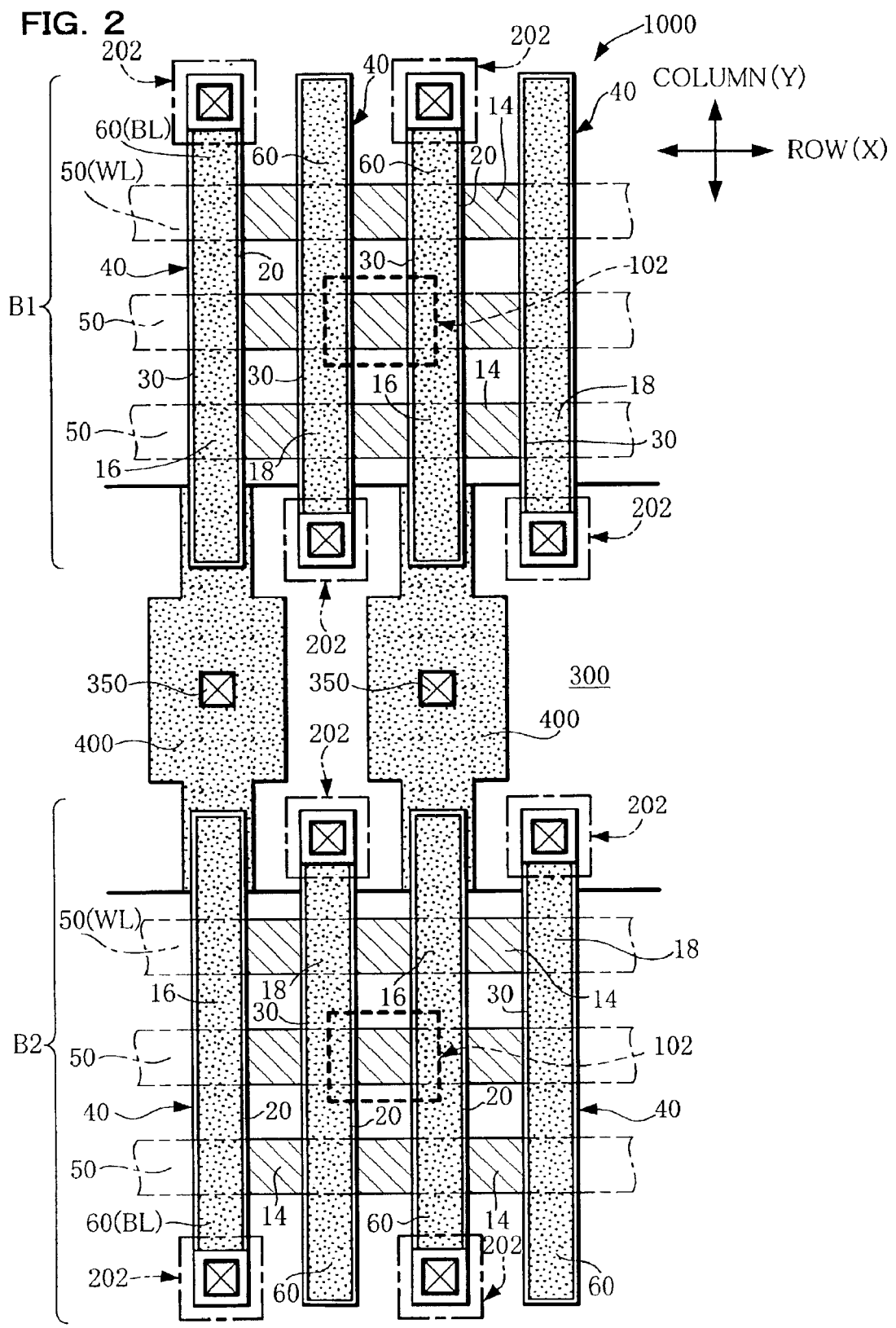
FIG. 2 is a schematic plan view showing essential components of a semiconductor integrated circuit that configures the semiconductor device according to the embodiment of the present invention.

The description first concerns the layout of the semiconductor device of this embodiment, with reference to FIG. 1. The semiconductor device of this embodiment comprises the capacitance device 100, which is configured of known non-volatile memory cells 102 arranged in a grid of a plurality of rows and columns, and a peripheral circuit section 2000 comprising capacitance devices 100. As shown in FIG. 2, the memory cell array 1000 is divided into a plurality of blocks (B1 and B2 in FIG. 2). The peripheral circuit section 2000 comprises the capacitance devices 100 formed above an isolation region 300. This peripheral circuit section 2000 could be an analog circuit, by way of example, and it could be formed in a peripheral region of the memory cell array 1000.

Figure 3:
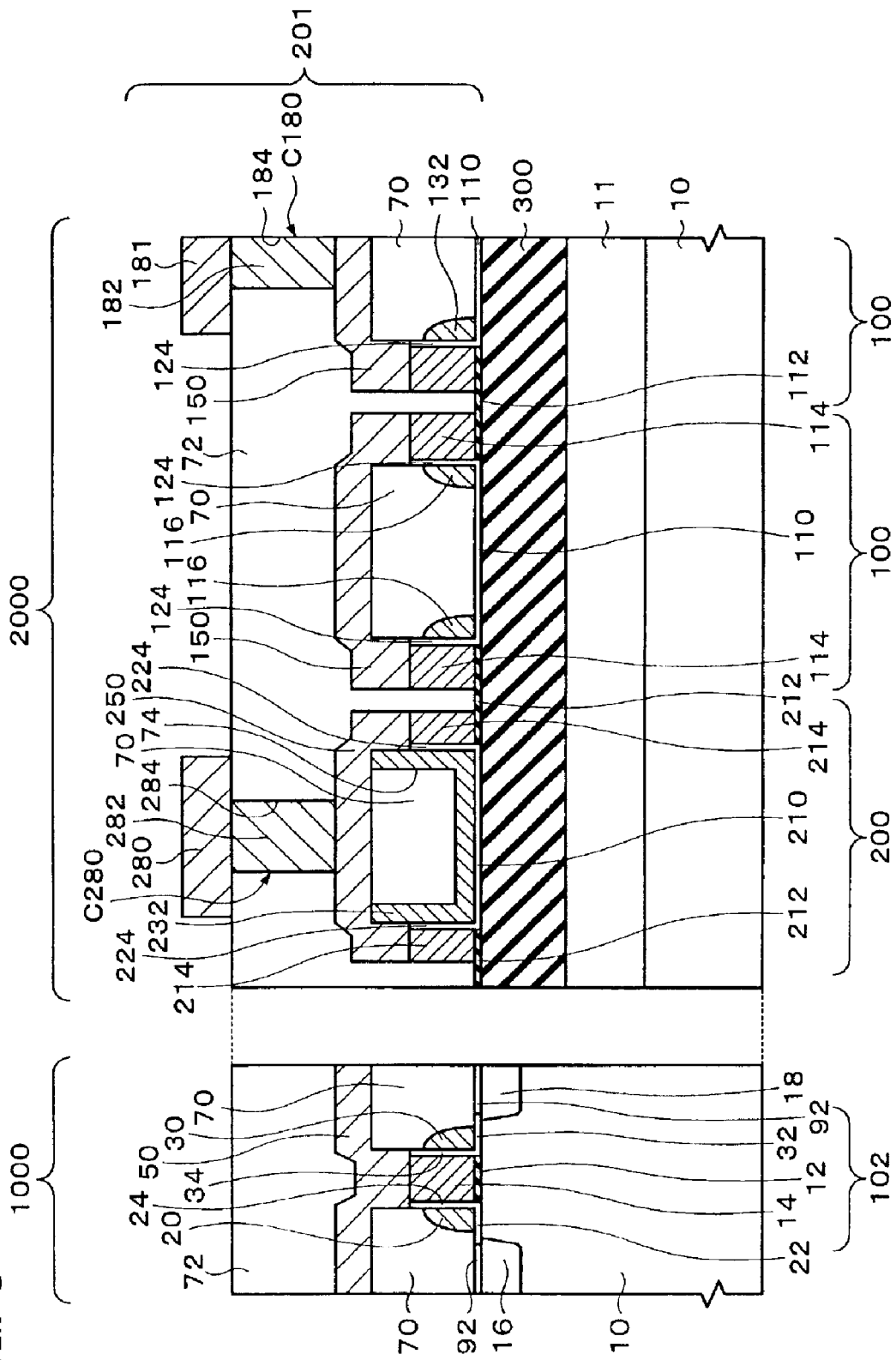
FIG. 3 is a schematic view of sections taken along the lines A—A and B—B in FIG. 1.

The description now turns to the capacitance devices 100 that configure the semiconductor device of this embodiment. Note that the semiconductor device of this embodiment relates to an example in which a plurality of the capacitance devices 100 are formed over the isolation region 300 in the peripheral circuit section 2000, as shown in FIG. 1. A well 11 is formed in the semiconductor substrate 10, as shown in FIG. 3, and the capacitance devices 100 are formed above the isolation region 300 which is formed in this well 11.

An annular contact region 117 configured of a doped layer is formed in the well 11, as shown in FIG. 1. The contact region 117 is connected to a reference power voltage (ground potential). The contact region 117 is formed to be $p^+$-type if the well 11 is a p-type well, or $n^+$-type if the well 11 is an n-type well.

Each capacitance device 100 comprises a first capacitor conductive layer 114, a first capacitor insulating layer 124 formed along a side surface of the first capacitor conductive layer 114, and a second capacitor conductive layer 116 disposed facing the first capacitor conductive layer 114 with the first capacitor insulating layer 124 therebetween.

The first capacitor conductive layer 114 is disposed above the isolation region 300 with a third capacitor insulating layer 112 therebetween. This first capacitor conductive layer 114 is arranged in a row direction (X-direction, or a first direction) together with the second capacitor conductive layer 116, as shown in FIG. 1, and both extend in a column direction (Y-direction, or a second direction). This first capacitor conductive layer 114 could be formed of a conductive layer of a material such as a polysilicon. A fourth contact conductive layer 150 is formed above the first capacitor conductive layer 114. This fourth contact conductive layer 150 forms part of a second contact section 201 that will be described later.

The second capacitor conductive layer 116 has the shape of a side wall, as shown in FIG. 3, and is disposed facing the isolation region 300 with a second capacitor insulating layer 110 therebetween and also facing the first capacitor conductive layer 114 with the first capacitor insulating layer 124 therebetween. In this case, the surface area of a section through the second capacitor conductive layer 116 in a plane parallel to the semiconductor substrate 10 is smaller as the distance from the isolation region 300 increases.

The first capacitor insulating layer 124 is formed along a side surface of the first capacitor conductive layer 114. This first capacitor insulating layer 124 is formed between the first capacitor conductive layer 114 and the second capacitor conductive layer 116.

The second capacitor conductive layer 116 is covered by an embedded insulating layer 70 and is also connected to a first contact conductive layer 232, as shown in FIG. 1. This first contact conductive layer 232 forms part of a first contact section 200 that will be described later. In this case, it is possible to set the capacitance to a predetermined value by setting the sectional area and length of the second capacitor conductive layer 116 to predetermined values.

In the semiconductor device of this embodiment, the second capacitor conductive layers 116 that configure a plurality of the capacitance devices 100 are arranged in the row direction (X-direction) and also extend in the column direction (Y-direction). In this embodiment, each of these second capacitor conductive layers 116 has a similar shape to that of first and second control gates 20 and 30 (described later) that form part of each memory cell 102.

The second capacitor conductive layer 116 is disposed above the isolation region 300 with the second capacitor insulating layer 110 therebetween.

The second capacitor insulating layer 110 and the first capacitor insulating layer 124 are linked and are also made of the same material. The first capacitor insulating layer 124 and the second capacitor insulating layer 110 can be formed as a stacked structure of a first silicon oxide layer, a silicon nitride layer, and a second silicon oxide layer.

The capacitance device 100 is connected electrically to the first contact section 200 and the second contact section 201. In other words, the second capacitor conductive layer 116 configuring each capacitance device 100 is connected electrically to the first contact section 200 by the link with the first contact conductive layer 232 that configures the first contact section 200. The capacitance device 100 and the second contact section 201 are connected electrically by the formation of the fourth contact conductive layer 150 configuring the second contact section 201 above the first capacitor conductive layer 114 configuring the capacitance device 100.

More specifically, each capacitance device 100 in the semiconductor device of this embodiment comprises two second capacitor conductive layers 116 and is also connected to the first and second contact sections 200 and 201. In other words, each of the two second capacitor conductive layers 116 comprised within one capacitance device 100 is connected to the first contact conductive layer 232 configuring the first contact section 200 and a fifth contact conductive layer 132 configuring the second contact section 201, to form a loop-shaped structure.

The first contact section 200 comprises the first contact conductive layer 232 and a pad-shaped second contact conductive layer 250, as shown in FIGS. 1 and 3. As will be described in detail later, the first contact conductive layer 232 is linked to the second capacitor conductive layer 116 that configures the capacitance device 100, as shown in FIG. 1. In this case, the first contact conductive layer 232 can be formed of the same material as the second capacitor conductive layer 116.

The second contact conductive layer 250 is disposed above the first contact conductive layer 232. A depression 74 is formed in the first contact conductive layer 232 and the embedded insulating layer 70 is embedded in this depression 74.

In the semiconductor device of this embodiment, the first contact section 200 further comprises a third contact conductive layer 214. The third contact conductive layer 214 is formed above the isolation region 300 with a first contact insulating layer 212 therebetween. The first contact conductive layer 232 is disposed on an inner side of the third contact conductive layer 214 with a first side insulating layer 224 therebetween. This third contact conductive layer 214 is made of the same material as the first capacitor conductive layer 114 configuring the second capacitor insulating layer 110 and is also fabricated by the same processing. In this case, the third contact conductive layer 214 of FIG. 1 is separated from the first capacitor conductive layer 114 configuring the capacitance device 100.

The first capacitor conductive layer 114 and the second contact section 201 of the capacitance device 100 are also connected electrically, as shown in FIG. 1.

The second contact section 201 comprises the fourth contact conductive layer 150 and the fifth contact conductive layer 132, as shown in FIGS. 1 and 3. More specifically, the first capacitor conductive layer 114 and the second contact section 201 are connected by the fourth contact conductive layer 150 that configures the second contact section 201. The fourth contact conductive layer 150 is formed of the same material as the second contact conductive layer 250 configuring the first contact section 200 and is also fabricated by the same processing. The fifth contact conductive layer 132 is linked to the second capacitor conductive layer 116 configuring the capacitance device 100, as shown in FIG. 1. In this case, this fifth contact conductive layer 132 can be made of the same material as the second capacitor conductive layer 116.

An interlayer insulating layer 72 is further formed over the semiconductor substrate 10 in which is formed the capacitance device 100. Contacts C180 and C280 are formed in the interlayer insulating layer 72 within the peripheral circuit section 2000. The contact C280 forms part of the first contact section 200, as shown in FIG. 3, and is made from a conductive layer 282 that is formed by filling a contact hole 284 that extends as far as the second contact conductive layer 250 with tungsten or aluminum, to connect to that second contact conductive layer 250. A wiring layer 280 is formed on the contact C280. This wiring layer 280 is formed on the interlayer insulating layer 72 and is also connected to the conductive layer 282. The contact C180 forms part of the second contact section 201 and has a configuration similar to that of the contact C280. In other words, a contact hole 184 and a conductive layer 182 that configure the contact C180 have similar configurations to those of the contact hole 284 and conductive layer 282 of the contact C280. The contact hole 184 is formed to extend as far as the fourth contact conductive layer 150 and the conductive layer 182 is connected to the fourth contact conductive layer 150. A wiring layer 181 is formed above the contact C180.

The description continues with the layout of the memory cell 102 that forms part of the memory cell array 1000 of the semiconductor device of this embodiment.

FIG. 2 shows the first block B1 and the second block B2 that is adjacent thereto. The first block B1 and the second block B2 are separated by the isolation region 300. Each of the blocks B1 and B2 is provided with a plurality of word lines 50 (WL) extending in the row direction (X-direction) and a plurality of bit lines 60 (BL) extending in the column direction (Y-direction). Each word line 50 is connected to a plurality of the word gates 14 arranged in the X-direction and each bit line 60 is formed of the impurity layers 16 and 18. In the semiconductor device of this embodiment, the word lines 50 are formed of the same material as the second contact conductive layer 250 configuring the first contact section 200 and the fourth contact conductive layer 150 configuring the second contact section 201.

The first and second control gates 20 and 30 are formed from a conductive layer 40 that extends along the side surfaces of the word gates 14 in the Y-direction. In the semiconductor device of this embodiment, each conductive layer 40 configuring the first and second control gates 20 and 30 is formed to surround the corresponding impurity layers 16 and 18. In other words, end portions of one set of the first and second control gates 20 and 30 are connected by a conductive layer extending in the X-direction. Similarly, the other end portions of the one set of the first and second control gates 20 and 30 is connected by a single common contact section 202. Each of the first and second control gates 20 and 30 thus functions as a control gate for the memory cell and also functions as wiring for connecting the control gates arranged in the Y-direction.

Each common contact section 202 is provided adjacent to the edge portions of the impurity layers 16 and 18, as shown in FIG. 1. In addition, these common contact sections 202 are provided with respect to the impurity layers 16 and 18 in such a manner that edge portions of one side of the impurity layers 16 and 18 alternate with edge portions of the other sides thereof. These common contact sections 202 are provided to enable the application of voltages to the first and second control gates 20 and 30.

A single memory cell 102 has one word gate 14, the first and second control gates 20 and 30 on either side of that word gate 14, and the impurity layers 16 and 18 within the semiconductor substrate 10 and that form portions positioned on the outer sides of these control gates 20 and 30. The impurity layers 16 and 18 are used in common by the memory cells 102 adjacent thereto.

The impurity layers 16 within the blocks B1 and B2 that are adjacent in the Y-direction are connected by a contact-use impurity layer 400 that is formed within the semiconductor substrate 10 at an end of each impurity layer 16 that does not have the common contact section 202. The bit lines 60 and contacts 350 are formed above this contact-use impurity layer 400. Similarly, the impurity layers 18 that are adjacent in the Y-direction are connected by another contact-use impurity layer (not shown in the figures) at ends thereof that do not have the common contact section 202.

The description now turns to the configuration of the memory cell 102 in plan view and in section, with reference to FIGS. 1 to 3.

The memory cell 102 has the word gate 14 formed on the main surface of the semiconductor substrate 10 with the first gate insulating layer 12 therebetween, the impurity layers 16 and 18 formed in the semiconductor substrate 10 to form the source region or drain region, and the first and second control gates 20 and 30 formed in the shape of side walls along both sides of the word gate 14. A silicide layer 92 is formed above the impurity layers 16 and 18. In the semiconductor device of this embodiment, each word gate 14 can be formed of the same material as the first capacitor conductive layer 114 configuring the capacitance device 100, as well as the third contact conductive layer 214 configuring the first contact section 200.

In the semiconductor device of this embodiment, the semiconductor substrate 10 is not particularly limited but it could have an n-type first well and a p-type second well formed with in this first well, by way of example. The first well functions to separate the second well electrically from the other regions of the semiconductor substrate 10.

The first control gate 20 is disposed facing the semiconductor substrate 10 with the second gate insulating layer 22 therebetween, and also facing one side surface of the word gate 14 with the second side insulating layer 24 therebetween. Similarly, the second control gate 30 is disposed facing the semiconductor substrate 10 with the second gate insulating layer 32 therebetween, and also facing the other side surface of the word gate 14 with the second side insulating layer 24 therebetween. These first and second control gates 20 and 30 have the same shape as the second capacitor conductive layer 116 that configures the capacitance device 100, and are also formed of the same material.

The second gate insulating layers 22 and 32 and the second side insulating layers 24 and 34 could be formed of the same material as that of the first capacitor insulating layer 124 formed on the side surface of the first capacitor conductive layer 114 and the second capacitor insulating layer 110 formed on the base surface of the second capacitor conductive layer 116. In other words, the second gate insulating layers 22 and 32 and the second side insulating layers 24 and 34 of the semiconductor device of this embodiment could be formed from an ONO film, more specifically of layers formed in sequence on the semiconductor substrate 10 side, such as a first silicon oxide layer, a silicon nitride layer, and a second silicon oxide layer.

The second gate insulating layers 22 and 32 function as charge accumulation regions. The first silicon oxide layer mainly functions as a tunnel film through which carriers (such as electrons) pass and the silicon nitride layer mainly functions as a charge accumulation layer for trapping carriers. The second side insulating layers 24 and 34 formed on either side of the word gate 14 function to separate the word gate 14 electrically from the first and second control gates 20 and 30. For that reason, the configurations of the second side insulating layers 24 and 34 are not specifically limited, provided they fulfil their function.

In the semiconductor device of this embodiment, the second side insulating layers 24 and 34 and the second gate insulating layers 22 and 32 are formed by the same film-formation processing and have the same layered structure. In addition, the second side insulating layers 24 and 34 are formed in such a manner that the upper edges thereof are positioned higher than the first and second control gates 20 and 30 with respect to the semiconductor substrate 10. The embedded insulating layer 70 is provided between the first control gate 20 of one memory cell 102 and the second control gate 30 of the neighboring memory cell 102 adjacent thereto. In the semiconductor device of this embodiment, the first and second control gates 20 and 30 are embedded within the embedded insulating layer 70. This embedded insulating layer 70 covers in such a manner that at least the first and second control gates 20 and 30 remain unexposed. More specifically, the embedded insulating layer 70 is formed in a state in which it protrudes higher than the upper edges of the second side insulating layers 24 and 34. By forming the embedded insulating layer 70 in this manner, it becomes possible to reliably isolate the first and second control gates 20 and 30 electrically from the word gate 14 and the word line 50.

The common contact section 202 is provided in order to apply voltages to the first and second control gates 20 and 30.

In the memory cell array 1000, the interlayer insulating layer 72 is formed in a manner similar to that of the first contact section 200 on the semiconductor substrate 10 on which the memory cells 102 are formed.

The semiconductor device in accordance with this embodiment comprises the capacitance device 100 formed above the isolation region 300, and this capacitance device 100 comprises the second capacitor conductive layer 116 in the form of a side wall, enabling a reduction in size required by the capacitance device, and also making it possible to ensure a predetermined capacitance. In particular, each capacitance device 100 in the semiconductor device in accordance with this embodiment comprises two second capacitor conductive layers 116 and is also connected to the first and second contact sections 200 and 201 so that the two second capacitor conductive layers are connected to the first contact conductive layer 232 configuring the first contact section 200 and the fifth contact conductive layer 132 configuring the second contact section 201 in a looped structure, enabling a further reduction in size and also ensuring a predetermined capacitance.

2. Semiconductor Device Fabrication Method

The description now turns to a method of fabricating the semiconductor device of this embodiment, with reference to FIGS. 4 to 12. The sections shown in FIGS. 4, 5, and 7 to 12 correspond to sections taken along the lines A—A and B—B in FIG. 1. The plan view of FIG. 6 corresponds to the plane of similar portions to those in FIG. 1. In FIGS. 4 to 12, portions that are substantially the same as those in FIGS. 1 to 3 are given the same reference numbers, and duplicated description is omitted.

Figure 4:
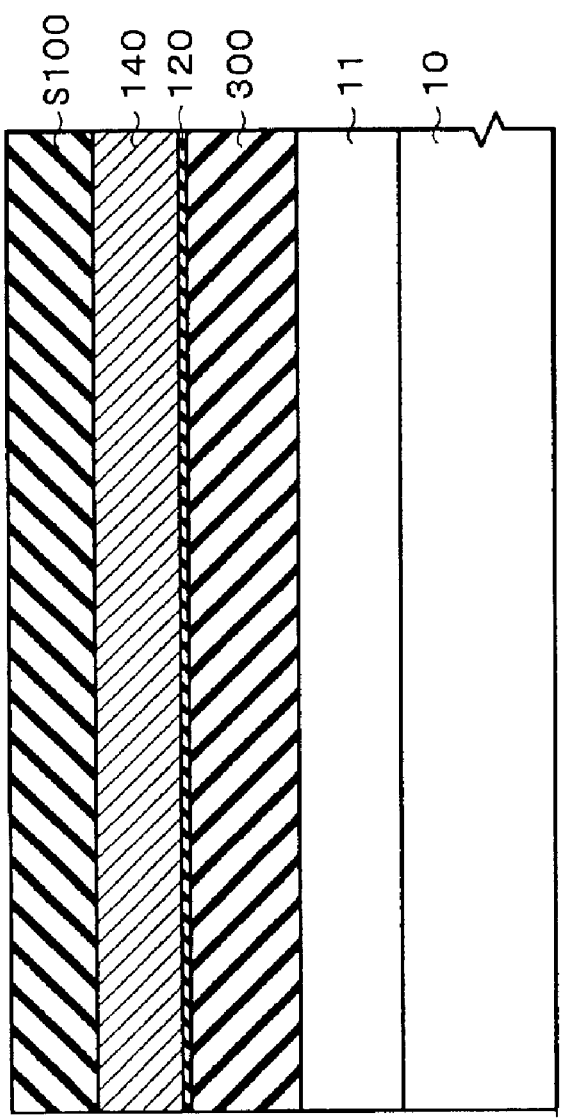
FIG. 4 is a sectional view showing part of the steps in a method of fabricating the semiconductor device of FIGS. 1 to 3.

(1) First of all, the isolation region 300 is formed in a predetermined area of the semiconductor substrate 10 within a region 2000a in which the peripheral circuit section 2000 (hereinafter called the "peripheral circuit section formation region") will be formed, by a method such as LOCOS or trench isolation, as shown in FIGS. 1 and 4. Wells, such as a deep n-type first well (not shown in the figure) and a p-type second well (not shown in the figure) that is shallower than the first well, are then formed. The contact-use impurity layer 400 (see FIG. 2) for the formation of the contact 350 (see FIG. 2) of the bit line 60 is then formed in the semiconductor substrate 10 within a region 1000a in which the memory cell array 1000 (hereinafter called the "memory cell array formation region") of FIG. 1 will be formed.

A first insulating layer 120, a first conductive layer 140 formed of doped polysilicon, and subsequently as topper layer S100 formed by a CMP process are then formed on the semiconductor substrate 10. A substance such as a silicon nitride layer could be used as the stopper layer S100, by way of example.

Figure 5:
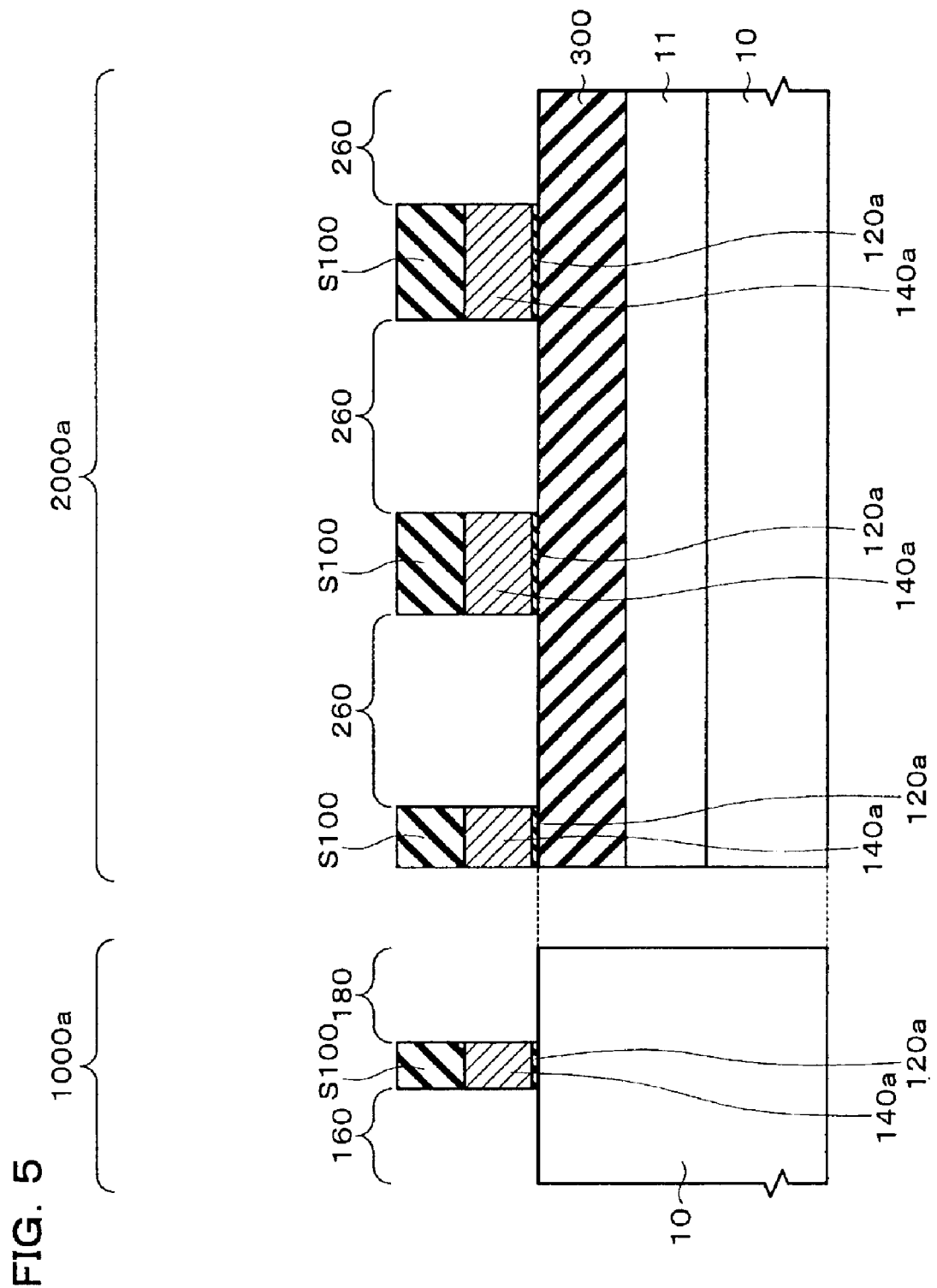
FIG. 5 is a sectional view showing part of the steps in the method of fabricating the semiconductor device of FIGS. 1 to 3.

(2) The first insulating layer 120, the first conductive layer 140 and the stopper layer S100 are then patterned by known lithography and etching techniques, as shown in FIG. 5. This processing forms a first insulating layer 120a and a first conductive layer 140a. The first capacitor conductive layer 114 that configures the capacitance device 100, the third contact conductive layer 214 that configures the first contact section 200, and the word gate 14 that configures the memory cell 102 are formed by subsequent processing from this first conductive layer 140a.

Figure 6:
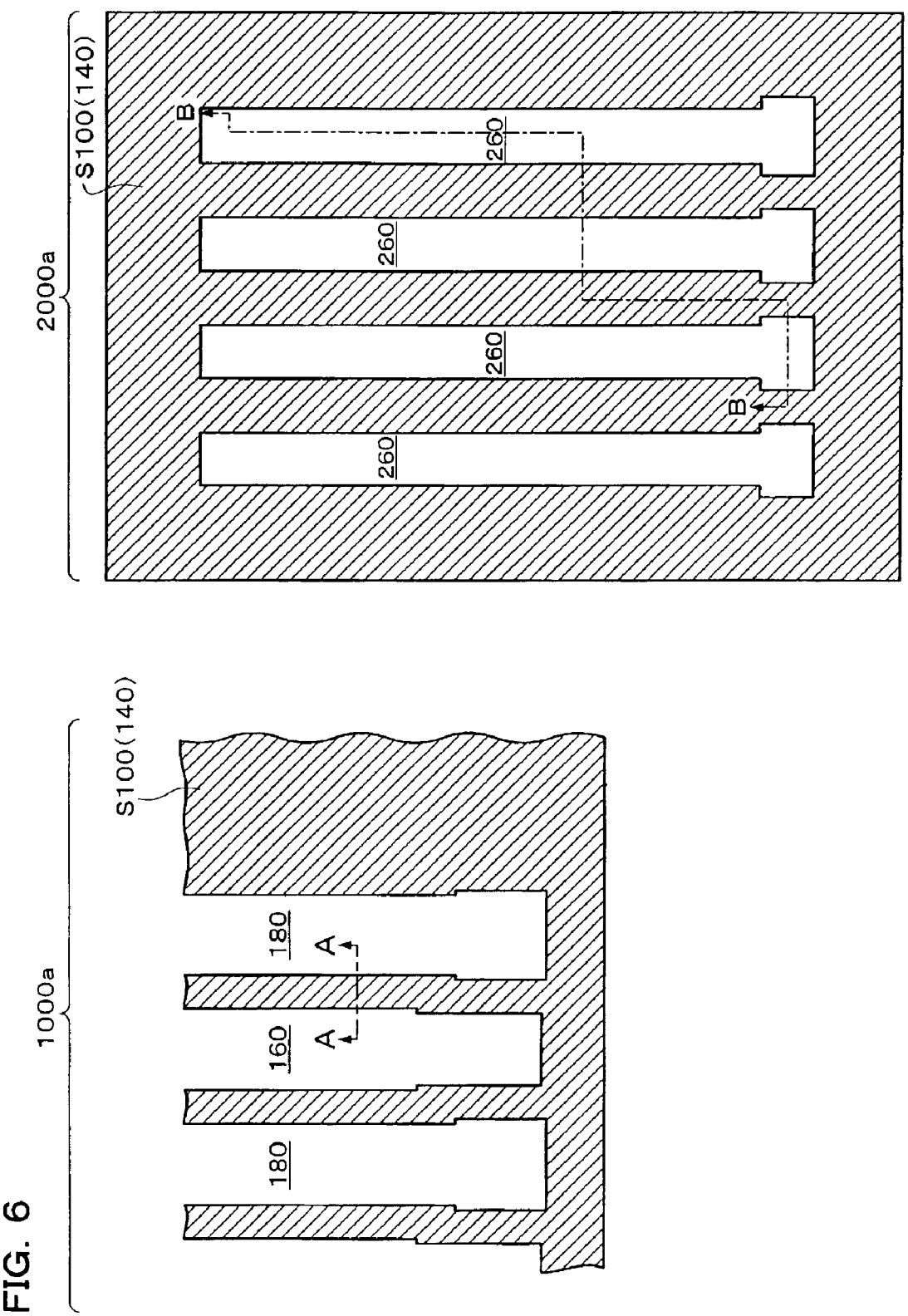
FIG. 6 is a plan view showing part of the steps in the method of fabricating the semiconductor device of FIG. 5.

During this patterning, layered bodies for the first insulating layer 120a, the first conductive layer 140a, and the stopper layer S100 are formed over the entire surface of the semiconductor substrate 10 in the peripheral circuit section formation region 2000a, except for aperture portions 260, as shown in FIG. 6. The aperture portions 260 correspond substantially to the regions in which the first capacitor insulating layer 124 and the second capacitor insulating layer 110 will be formed by subsequent processing, and the second capacitor conductive layer 116 will be formed along the edge portions of these aperture portions 260. During this patterning, layered bodies for the first insulating layer 120a, the first conductive layer 140a and the stopper layer S100 are formed over the entire surface of the semiconductor substrate 10 in the memory cell array formation region 1000a, except for aperture portions 160 and 180. The aperture portions 160 and 180 correspond substantially to regions in which the impurity layers 16 and 18 will be formed by subsequent ion implantation. In addition, the second side insulating layers 24 and 34 and the first and second control gates 20 and 30 will be formed by subsequent processing along the edge portions of the aperture portions 160 and 180.

Figure 7:
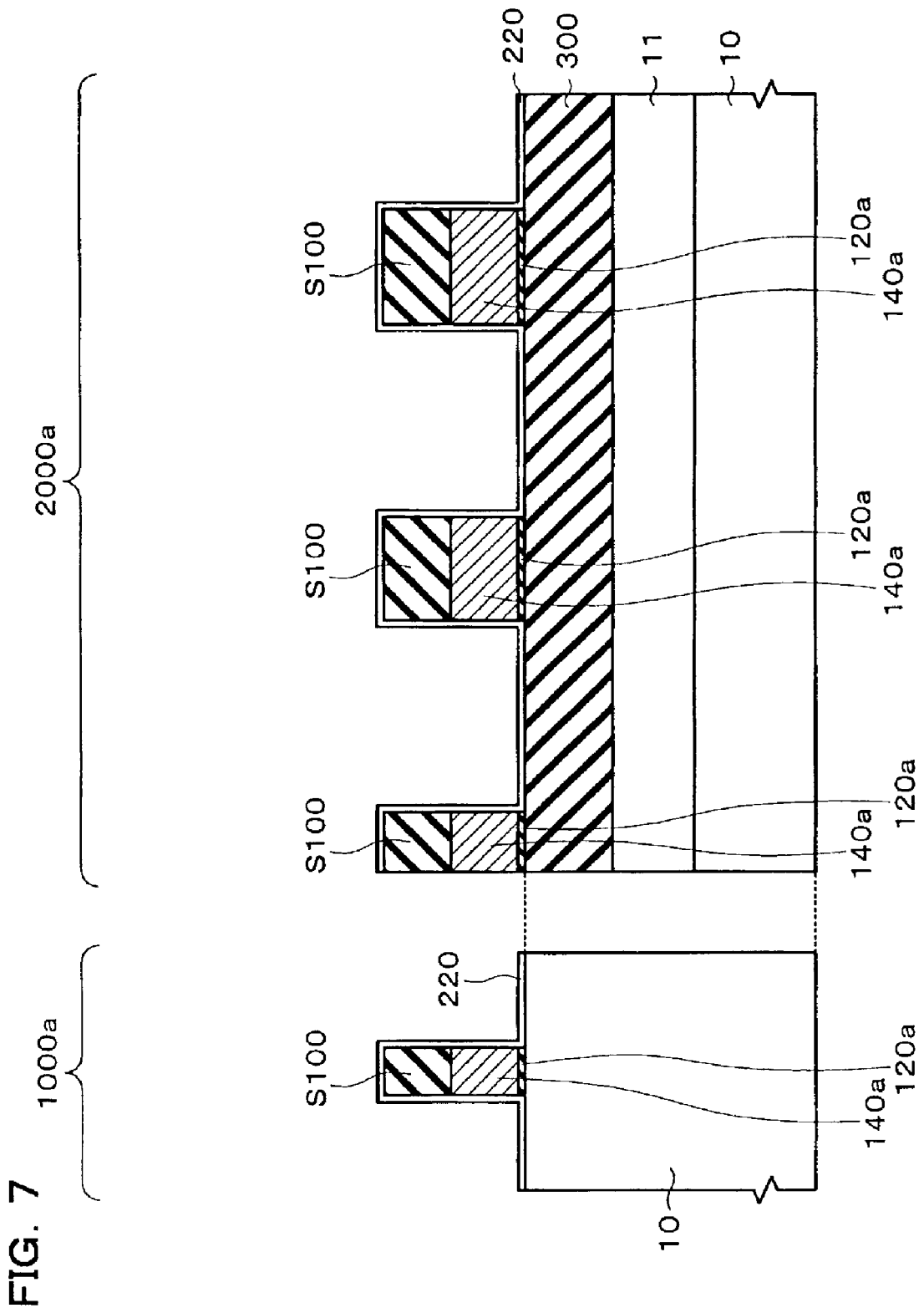
FIG. 7 is a sectional view showing part of the steps in the method of fabricating the semiconductor device of FIGS. 1 to 3.

(3) An ONO film (insulating layers) is formed over the entire surface of the semiconductor substrate 10 on which the layered bodies of the first insulating layer 120a, the first conductive layer 140a, and the stopper layer S100 have been formed, as shown in FIG. 7. The ONO film 220 is formed by sequentially depositing a first silicon oxide layer, a silicon nitride layer, and a second silicon oxide layer, by way of example. The first silicon oxide layer could be a film formed by a process such as thermal oxidation or CVD, by way of example. Note that if the first silicon oxide layer is to be formed by thermal oxidation, that first silicon oxide layer is formed on a side surface of the first conductive layer 140a. The silicon nitride layer could be formed as a film by a method such as CVD after annealing in an ammonia atmosphere, by way of example. The second silicon oxide layer could be formed as a film using CVD, such as by high-temperature oxidation. It is preferable to perform annealing after these films have been formed, to reduce the size of each layer.

The second capacitor insulating layer 110 and the first capacitor insulating layer 124 that configure the capacitance device 100 together with a second contact insulating layer 210 and the first side insulating layer 224 that configure the first contact section 200 are formed as shown in FIG. 3 in the peripheral circuit section 2000 by subsequent patterning of the ONO film 220 formed of the first silicon oxide layer, silicon nitride layer, and second silicon oxide layer. This ONO film 220 also configures the second gate insulating layers 22 and 32 and the second side insulating layers 24 and 34 for the first and second control gates 20 and 30 that configure the memory cell 102, within the memory cell array formation region 1000a is formed.

Figure 8:
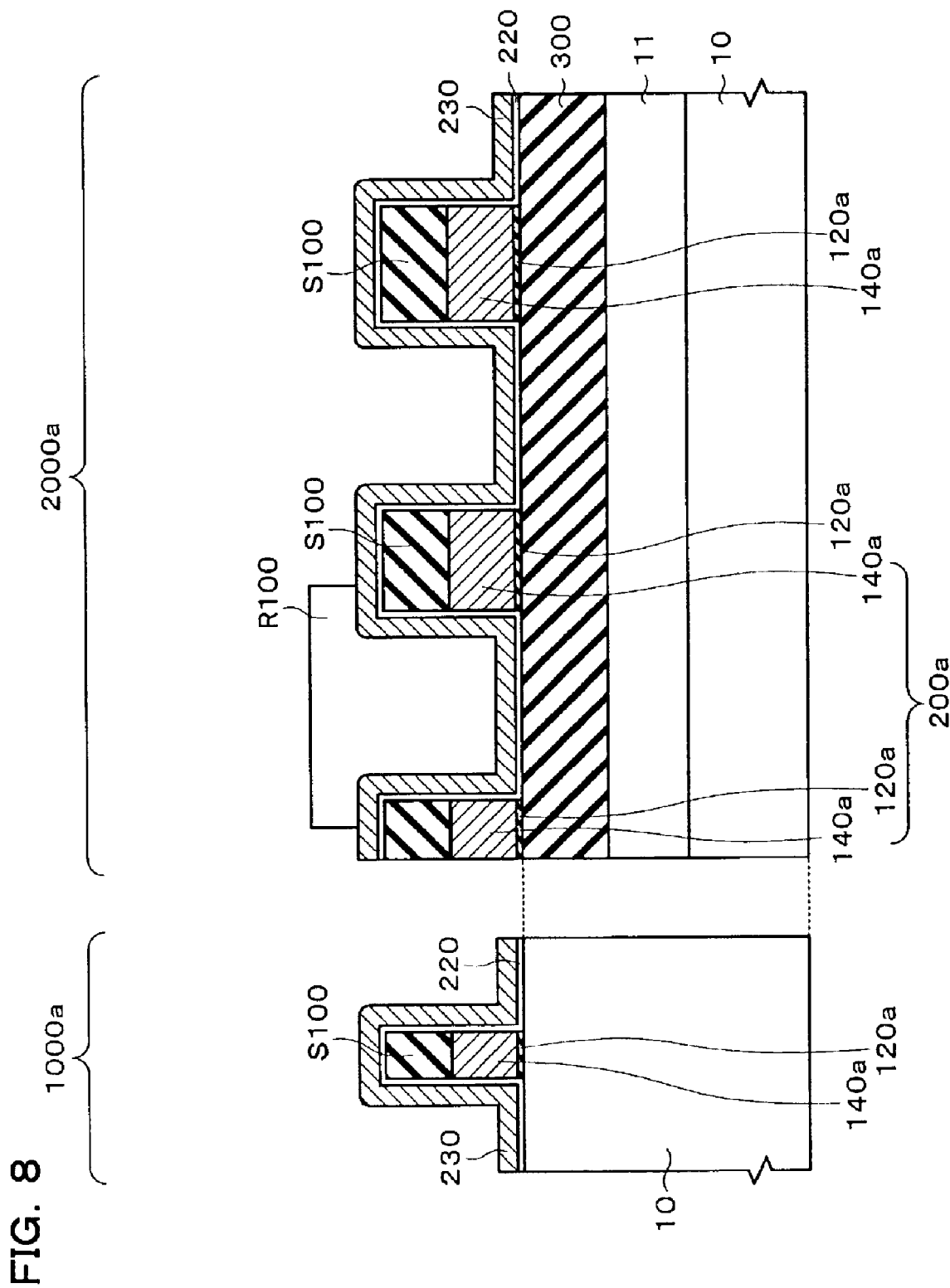
FIG. 8 is a sectional view showing part of the steps in the method of fabricating the semiconductor device of FIGS. 1 to 3.

(4) A doped polysilicon layer (second conductive layer) 230 is then formed over the entire surface of the ONO film 220, as shown in FIG. 8. The second capacitor conductive layer 116 that configures the second capacitor insulating layer 110, the first contact conductive layer 232 that configures the first contact section 200 (see FIG. 3), and also the conductive layer 40 that configures the first and second control gates 20 and 30 (see FIG. 2) are formed by subsequent processing of the doped polysilicon layer 230.

A resist layer R100 is then formed in a region 200a in which the first contact section 200 will be formed (hereinafter called the "first contact section formation region"). In this embodiment, this resist layer R100 is provided at a position that substantially corresponds to the region in which the first contact section 200 will be formed, as shown in FIG. 8. In other words, this resist layer R100 is formed over at least the region in which the first contact conductive layer 232 will be formed by subsequent processing.

Figure 9:
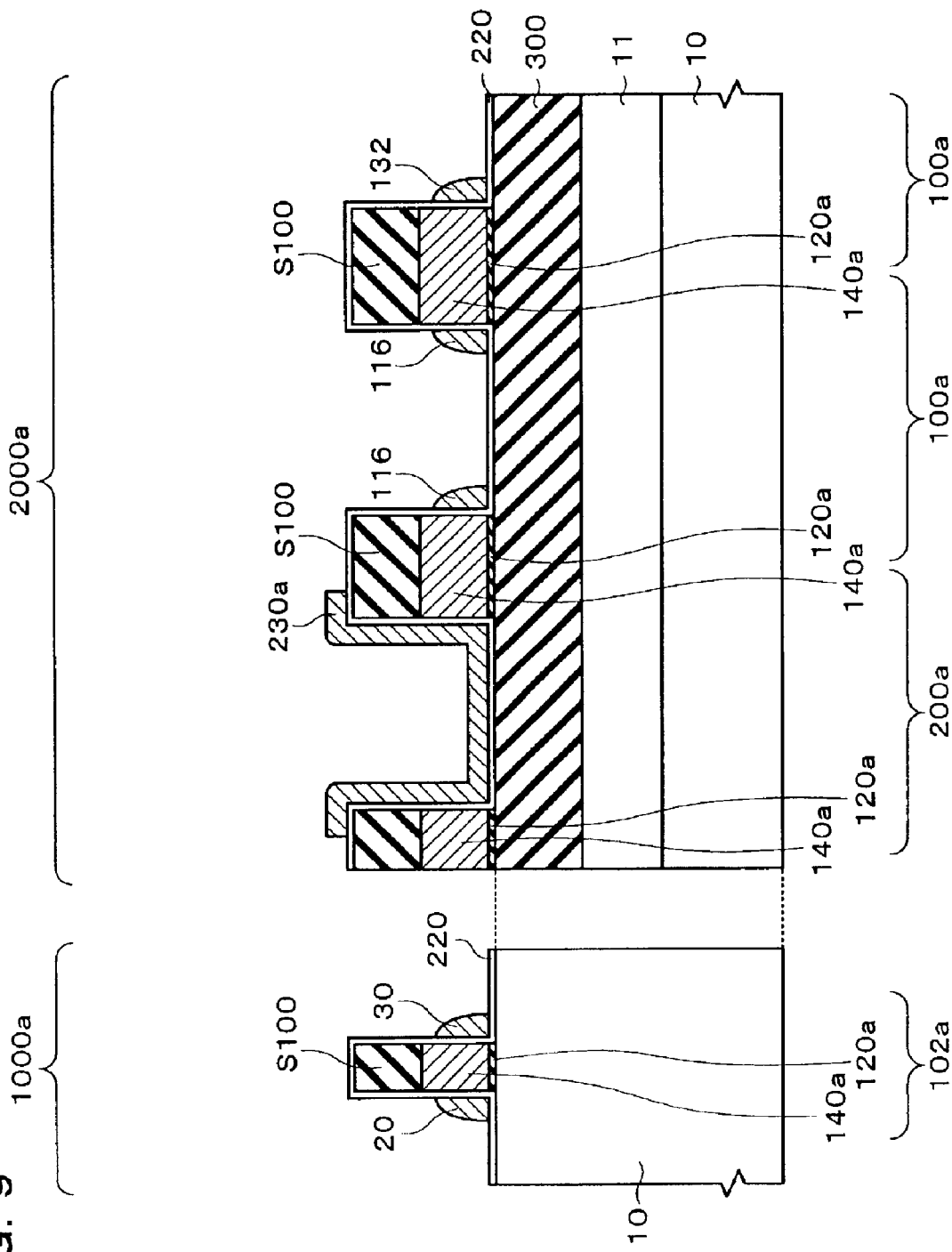
FIG. 9 is a sectional view showing part of the steps in the method of fabricating the semiconductor device of FIGS. 1 to 3.

(5) A contact conductive layer 230a is then formed by anisotropic etching of the entire surface of the doped polysilicon layer 230 (see FIG. 8), together with the first and second control gates 20 and 30 in the memory cell array formation region 1000a, as shown in FIG. 9. In other words, the second capacitor conductive layer 116 is formed in the form of a side wall by this processing along a side surface of the exposed aperture portions 260 (see FIG. 8), in a state in which the first capacitor insulating layer 124 shown in FIG. 3 is interposed therebetween. Simultaneously therewith, the contact conductive layer 230a for forming the first contact section 200 is formed linked to the second capacitor conductive layer 116 in the portion masked by the resist layer R100. During this processing, the second capacitor conductive layer 116 is formed and also the fifth contact conductive layer 132 linked to the second capacitor conductive layer 116 is formed. This fifth contact conductive layer 132 configures part of the second contact section 201 (see FIG. 3) that will be formed by processing that will be described layer.

In addition, the second capacitor conductive layer 116 is formed and also the first and second control gates 20 and 30 in the form of side walls are formed on the ONO film 220 along the side surfaces of the exposed aperture portions 160 and 180 (see FIG. 6), in a state in which the second side insulating layers 24 and 34 are interposed therebetween. The resist layer R100 is then removed by a known method such as dissolving or ashing.

To enable the formation of the contact region 117 (see FIG. 1) by subsequent processing, predetermined regions of the stopper layer S100 and the ONO film 220 are removed by etching, then the first conductive layer 140a is removed from within the portion where this stopper layer S100 has been removed, to form a region (not shown in the figure) for the formation of them contact region 117.

Figure 10:
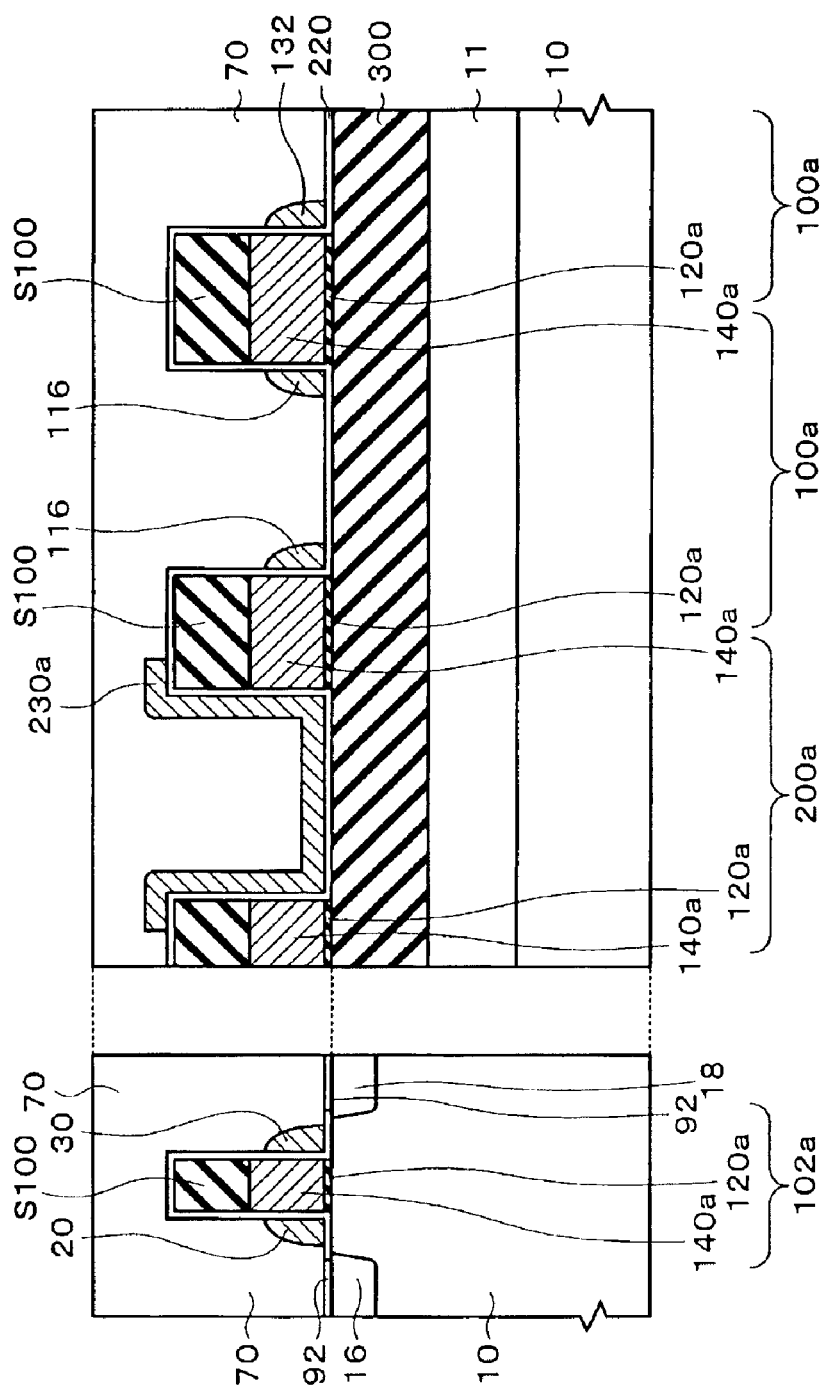
FIG. 10 is a sectional view showing part of the steps in the method of fabricating the semiconductor device of FIGS. 1 to 3.

(6) The impurity layers 16 and 18 that configure the source and drain regions are then formed by the implantation of ions of an impurity such as an n-type impurity into the entire surface of predetermined regions within the semiconductor substrate 10, in the memory cell array formation region 1000a, as shown in FIG. 10. The contact region 117 is formed by the implantation of ions of an impurity such as a p-type impurity into the region for the formation of the contact region 117 (see FIG. 1), which was described previously, in the peripheral circuit section formation region 2000a. This contact region 117 is formed in a region surrounding the capacitance device 100 within the semiconductor substrate 10, as shown in FIG. 1.

The silicide layer 92 is then formed by a known method of a metal such as titanium or cobalt on exposed surfaces of the impurity layers 16 and 18.

An insulating layer (second insulating layer) 70 of a substance such as silicon oxide or silicon nitride oxide is then formed over the entire surface. The embedded insulating layer 70 is formed to cover the stopper layer S100 and also fill in the gaps beside the first and second control gates 20 and 30, within the contact conductive layer 230a, and also the gap between adjacent second capacitor conductive layers 116.

Figure 11:
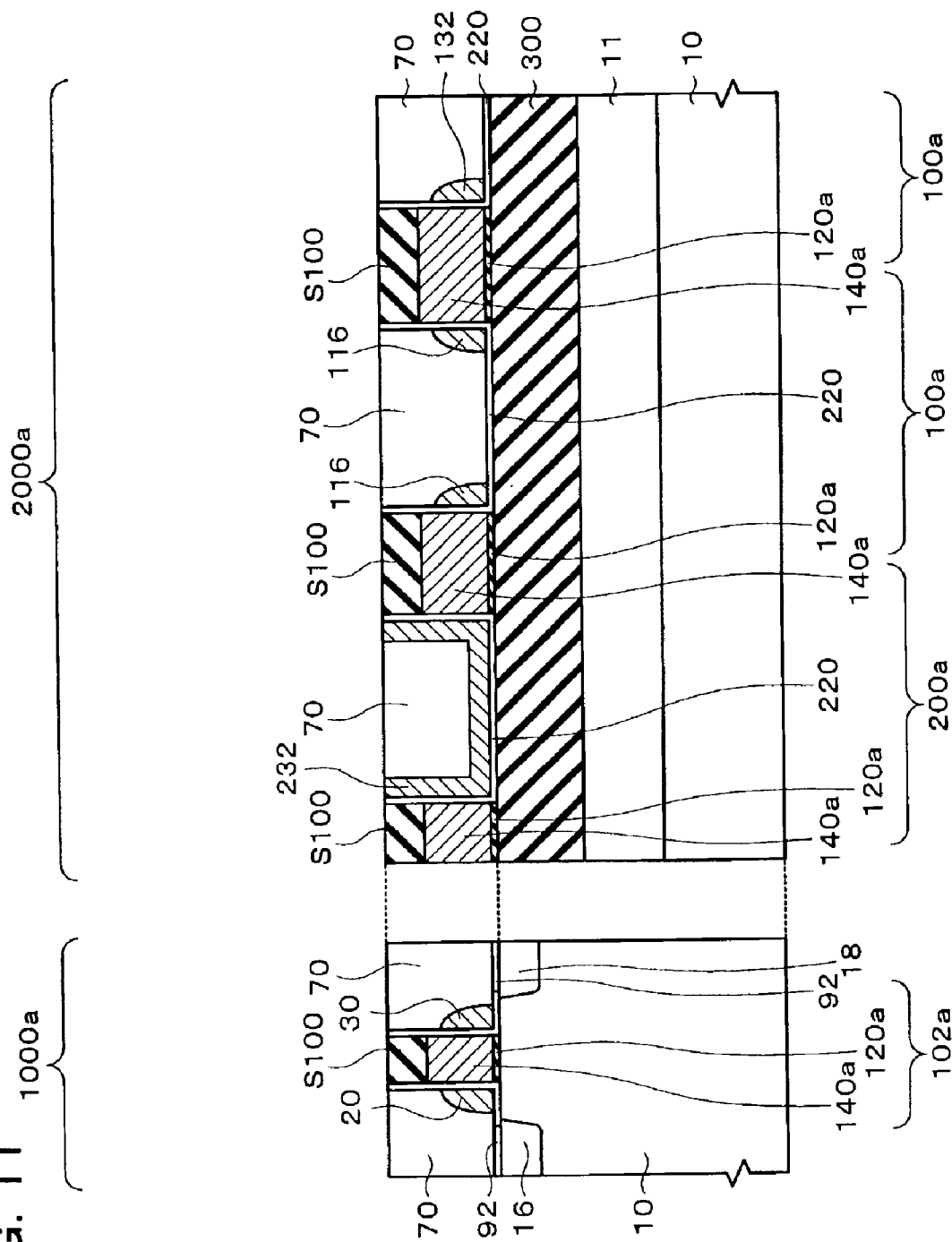
FIG. 11 is a sectional view showing part of the steps in the method of fabricating the semiconductor device of FIGS. 1 to 3.

(7) The insulating layer 70 is then polished by CMP until the stopper layer S100 is exposed, to flatten the embedded insulating layer 70 as shown in FIG. 11. This processing forms the first contact conductive layer 232 within the first contact section formation region 200a. The ONO film 220 formed along the side surfaces of the first conductive layer 140a and the stopper layer S100 remains in a state in which it protrudes higher than the first and second control gates 20 and 30.

This processing completely covers the first and second control gates 20 and 30 together with the second capacitor conductive layer 116 by the embedded insulating layer 70. The upper surface of the first contact conductive layer 232 is exposed within the first contact section formation region 200a, as shown in FIG. 11. The depression 74 formed from the first contact conductive layer 232 is in a state in which it is embedded in the embedded insulating layer 70.

Figure 12:
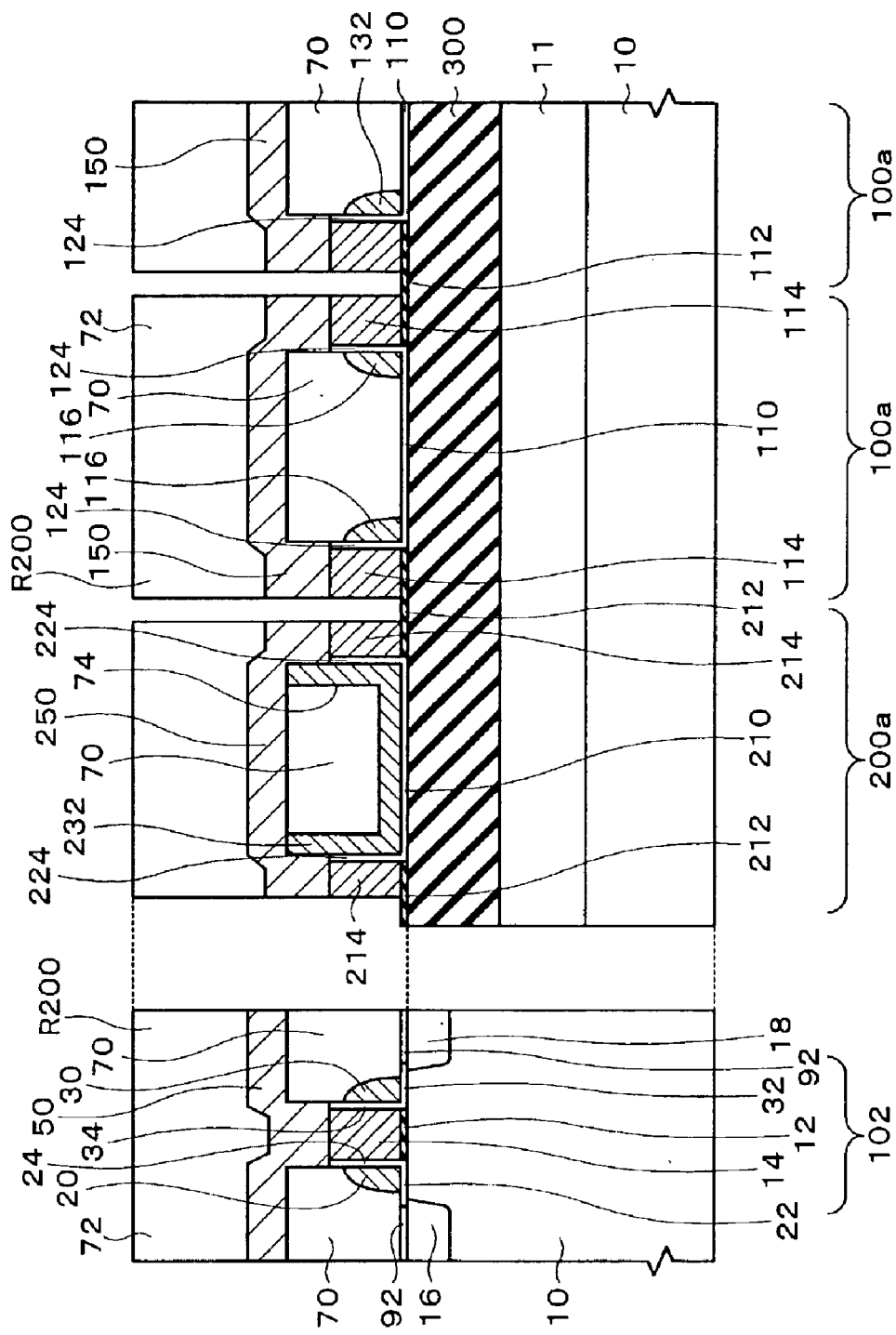
FIG. 12 is a sectional view showing part of the steps in the method of fabricating the semiconductor device of FIGS. 1 to 3.

(8) After the stopper layer S100 formed over the first conductive layer 140a has been removed, a third conductive layer (not shown in the figure) is formed over the entire surface, then a resist layer R200 is formed as shown in FIG. 12 and that third conductive layer is patterned as shown in FIG. 12. This forms the word line 50 over the first conductive layer 140a (see FIG. 11) and also forms the second contact conductive layer 250 over the first contact conductive layer 232 and the fourth contact conductive layer 150 over the first capacitor conductive layer 114 in the peripheral circuit section formation region 2000a. The above described step forms both the first capacitor insulating layer 124 on the side surface of the second capacitor conductive layer 116 and the first side insulating layer 224 on the side surface of the first contact conductive layer 232 in the peripheral circuit section formation region 2000a, and also forms the second side insulating layers 24 and 34 on the side surfaces of the first and second control gates 20 and 30 in the memory cell array formation region 1000a. Simultaneously therewith, the second capacitor insulating layer 110 is formed on the base surface of the second capacitor conductive layer 116 and the second contact insulating layer 210 is formed on the base surface of the first contact conductive layer 232 in the peripheral circuit section formation region 2000a, and also the second gate insulating layers 22 and 32 are formed on the base surfaces of the first and second control gates 20 and 30 in the memory cell array formation region 1000a.

The first capacitor insulating layer 124, the first side insulating layer 224, the second side insulating layers 24 and 34, the second capacitor insulating layer 110, the second contact insulating layer 210, and the second gate insulating layers 22 and 32 are all formed from the ONO film 220. In other words, these layers are formed from the stack of a first silicon oxide layer, a silicon nitride layer, and a second silicon oxide layer.

This third conductive layer could be formed by using a doped polysilicon layer, a metal layer, or layer of an alloy such as a silicide, or by using a combination of two or more such layers. The resist layer R200 is used as a mask to remove the first conductive layer 140a existing between the second capacitor conductive layer 116 in the peripheral circuit section formation region 2000a and also the first conductive layer 140a is patterned in the memory cell array formation region 1000a to form the word gates 14 that are arranged in an array. The above described step forms the third capacitor insulating layer 112 on the base surface of the first capacitor conductive layer 114 and the first contact insulating layer 212 on the base surface of the third contact conductive layer 214 within the peripheral circuit section formation region 2000a, and also form the first gate insulating layer 12 on the base surface of each word gate 14 in the memory cell array formation region 1000a. One of the third capacitor insulating layer 112, the first contact insulating layer 212, and the first gate insulating layer 12 is formed from the first insulating layer 120.

If necessary, a p-type impurity is doped into the entire surface of the semiconductor substrate 10. This forms a p-type impurity layer (isolation impurity layer) 15 (see FIG. 1) in the regions between the word gates 14 in the Y-direction. This isolation impurity layer 15 is formed to have the opposite conductivity type from that of the non-volatile memory cell. This p-type impurity layer 15 ensures reliable isolation between individual memory cells 102.

(9) After an interlayer insulating layer has be superimposed, contact holes are formed by a known method, a conductive layer is formed in the contact holes, then a wiring layer that provides electrical connection with that conductive layer can be formed. For example, the contact holes 184 and 284 are formed in the interlayer insulating layer 72 as shown in FIG. 3, then the contacts C180 and C280 are formed by filling the contact holes 184 and 284 with the corresponding conductive layers 182 and 282, and the wiring layers 181 and 280 connecting those contacts C180 and C280 are formed. This forms the first contact section 200 and the second contact section 201.

The semiconductor device of this embodiment can be fabricated by the above described steps. The semiconductor device obtained by the above described process comprises the peripheral circuit section 2000, which comprises the capacitance device 100, the first contact section 200, and the second contact section 201, and the memory cell array 1000, which comprises the memory cell 102.

The fabrication method of this embodiment as described above makes it possible to form the capacitance device 100 that comprises the second capacitor conductive layer 116 in the form of a sidewall. This second capacitor conductive layer 116 enables a reduction in size due to the formation thereof along a side surface of the first capacitor conductive layer 114, and also makes it possible to obtain a capacitance device having a predetermined capacitance.

Since the fabrication method of this embodiment enables the formation of the second capacitor conductive layer 116 and the first and second control gates 20 and 30 in the form of side walls, there is no need for any excess processing for forming the capacitance device, enabling a reduction in the number of fabrication steps.

The fabrication method of this embodiment ensures that the second contact conductive layer 250 is provided on the first contact conductive layer 232 and the conductive layer 282 is provided on the second contact conductive layer 250, in the first contact section 200 connected to the capacitance device 100. This configuration makes it possible to ensure some leeway for alignment during the formation of this conductive layer 282.

3. Modification

The description now turns to a modification of the semiconductor device in accordance with this embodiment. A plan view of this modification of the semiconductor device of this embodiment is shown in FIG. 13 and sections through the lines A—A and B—B of FIG. 13 as shown schematically in FIG. 14.

Figure 13:
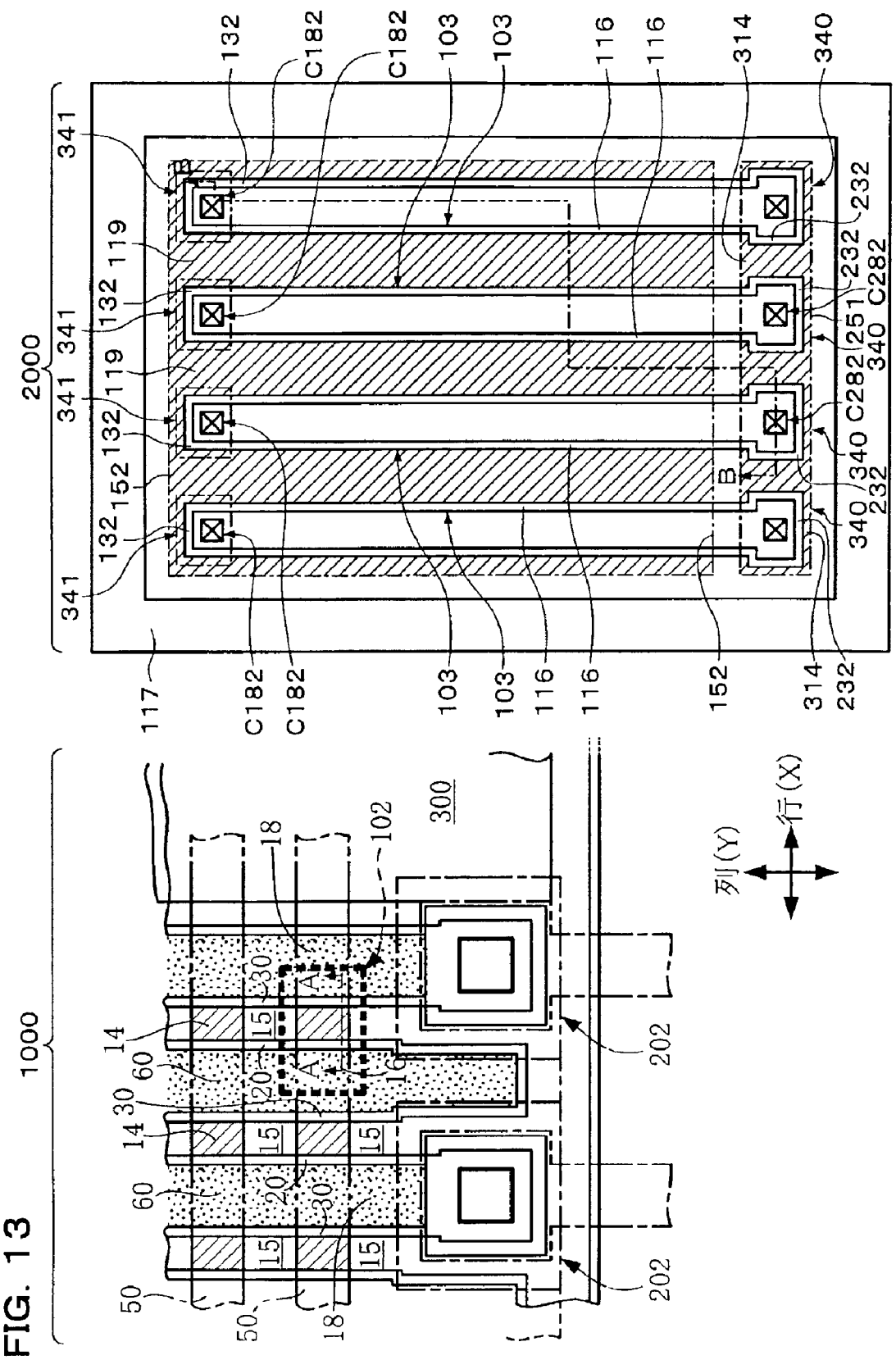
FIG. 13 is a plan view showing a modification of the semiconductor device according to the embodiment of the present invention.
Figure 14:
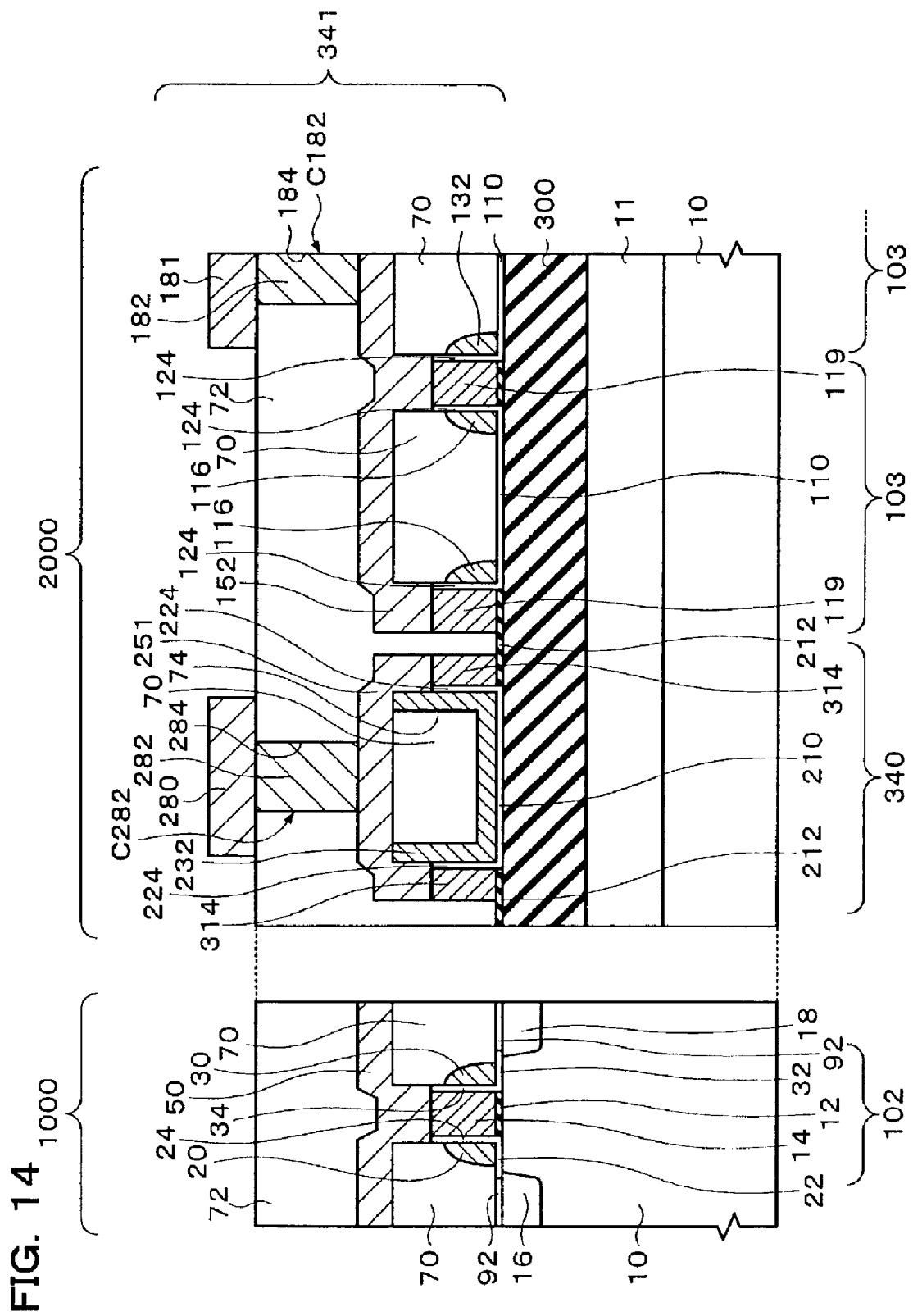
FIG. 14 is a schematic view of sections taken along the lines A—A and B—B in FIG. 13.

The semiconductor device shown in FIGS. 13 and 14 comprises the capacitance device 100 and the first contact section 200, in the same way as the semiconductor device of this embodiment as shown in FIGS. 1 to 3.

The memory cell array 1000 has a configuration similar to that of the semiconductor device of this embodiment as shown in FIGS. 1 to 3. The peripheral circuit section 2000 comprises a capacitance device 103 and first and second contact sections 340 and 341 connected to the capacitance device 103. The capacitance device 103 has the second capacitor conductive layer 116 in the form of a side wall, in a similar manner to that of the semiconductor device shown in FIGS. 1 to 3. Note that portions of the memory cell array 1000 and the peripheral circuit section 2000 shown in FIGS. 13 and 14 that have a configuration similar to those in the semiconductor device shown in FIGS. 1 to 3 are denoted by the same reference numbers and further description thereof is omitted.

A second contact conductive layer 251 that configures the first contact section 340 is formed over the first contact conductive layer 232, in a similar manner to the second contact conductive layer 250 that configures the first contact section 200 (see FIGS. 1 to 3). Similarly, a fourth contact conductive layer 152 that configures the second contact section 341 is formed over a first capacitor conductive layer 119 is formed over the first capacitor conductive layer 119, in a similar manner to the fourth contact conductive layer 150 that configures the second contact section 201 (see FIGS. 1 to 3).

However, the modification shown in FIGS. 13 and 14 differs from the semiconductor device shown in FIGS. 1 to 3 in that the fourth contact conductive layer 152 extends over the capacitance devices 103. In other words, in the semiconductor device shown in FIGS. 1 to 3, the fourth contact conductive layer 150 is separately provided for each capacitance device 100, whereas in the modification shown in FIGS. 13 and 14 the fourth contact conductive layer 152 extends over the capacitance devices 103.

In addition, the second contact conductive layer 251 that configures each first contact section 340 is linked in the modification shown in FIGS. 13 and 14, whereas the second contact conductive layer 250 is formed separately for each first contact section 340 in the semiconductor device shown in FIGS. 1 to 3. The modification shown in FIGS. 13 and 14 has a configuration that differs from that of the semiconductor device shown in FIGS. 1 to 3 in those points.

Furthermore, the width and pitch of the first capacitor conductive layer 119 that configures the capacitance device 103 in the modification shown in FIGS. 13 and 14 can be formed to be substantially the same as the width and pitch of the word gates 14 that configure the memory cells 102. In other words, the first capacitor conductive layer 119 that configures the capacitance device 103 can be formed by using the layout design used during the formation of the word gates 14 of the memory cells 102.

The semiconductor device shown in FIGS. 13 and 14 can be fabricated by substantially the same method as that described previously for the semiconductor device of this embodiment (see FIGS. 5 to 12). It should be noted, however, that to obtain the semiconductor device shown in FIGS. 13 and 14, the second contact conductive layer 251 and the fourth contact conductive layer 152 are patterned to have an extended shape by a step corresponding to the step shown in FIG. 12.

4. Another Modification

The description now turns to another modification of the semiconductor device in accordance with this embodiment. A plan view of this modification of the semiconductor device is shown in FIG. 15, and a plan view showing part of the steps in the process of fabricating this modification of the semiconductor device, corresponding to part of the steps in the fabrication of the semiconductor device shown in FIG. 6, is shown in FIG. 16.

Figure 15:
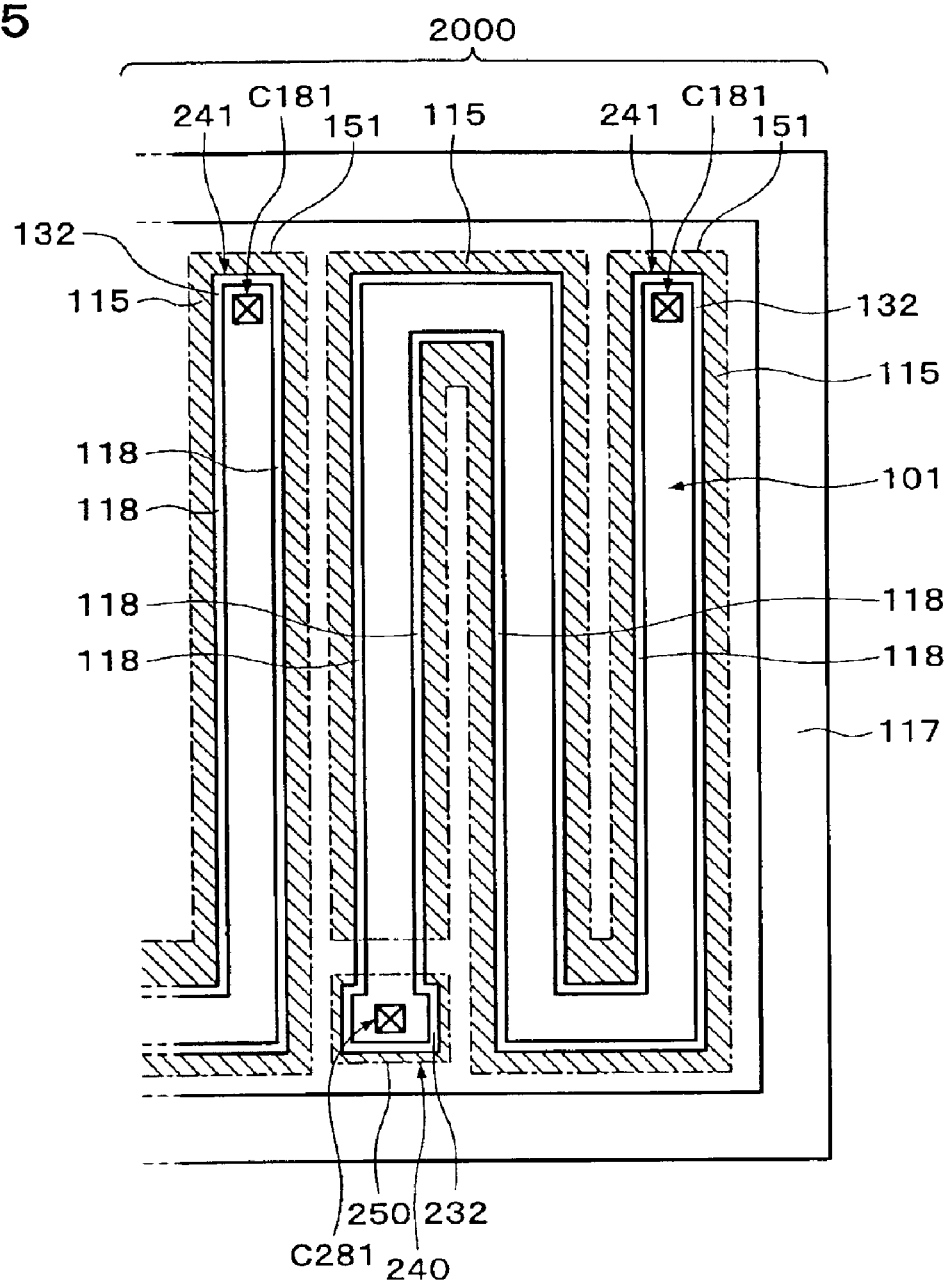
FIG. 15 is a plan view showing another modification of the semiconductor device according to the embodiment of the present invention.
Figure 16:
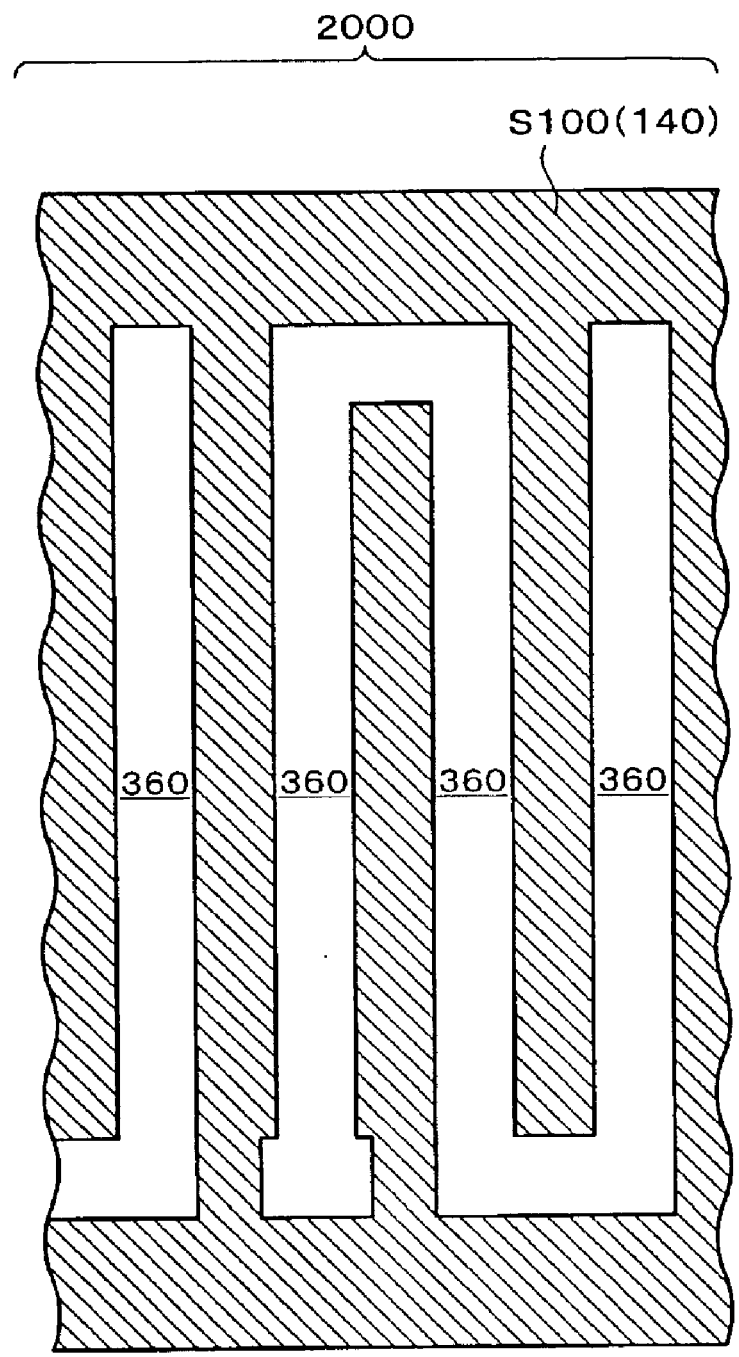
FIG. 16 is a plan view showing part of the steps in the method of fabricating the modification of FIG. 15, corresponding to part of the steps in the method of fabricating the semiconductor device according to the embodiment shown in FIG. 6.
Figure 17:
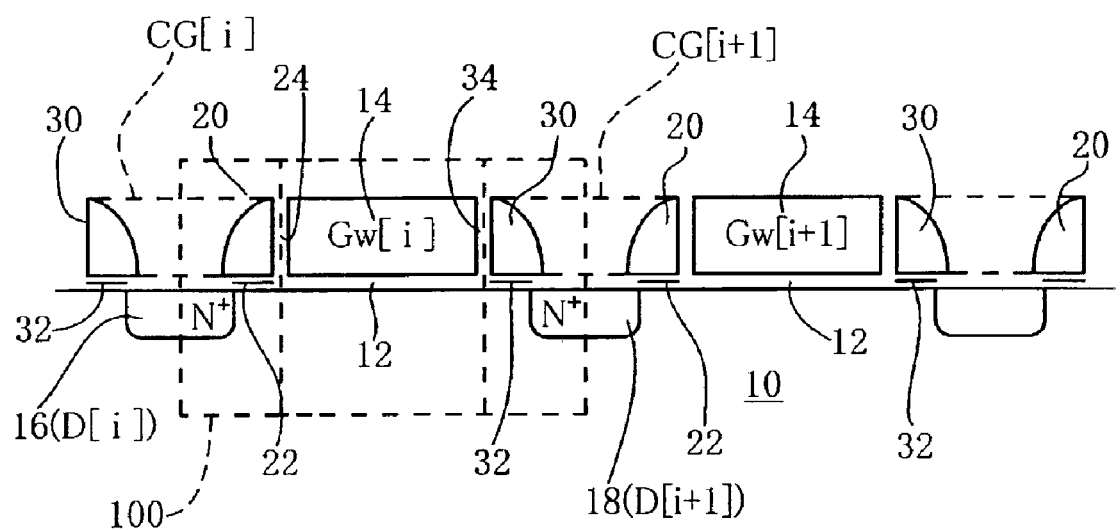
FIG. 17 is a sectional view through a known MONOS-type memory cell.

The semiconductor device shown in FIG. 15 comprises the memory cell array 1000 and the peripheral circuit section 2000 in a similar manner to the semiconductor device of this embodiment shown in FIGS. 1 to 3. Note that since the memory cell array 1000 has a configuration similar to that of the semiconductor device of this embodiment shown in FIGS. 1 to 3, FIG. 15 shows only the peripheral circuit section 2000. This peripheral circuit section 2000 comprises a capacitance device 101 and first and second contact sections 240 and 241 connected to the capacitance device 101, in a similar manner to the semiconductor device of this embodiment shown in FIGS. 1 to 3. The configuration of the first contact section 240 is similar to that of the first contact section 200 (see FIGS. 1 to 3). In the second contact section 241, a fourth contact conductive layer 151 and a first capacitor conductive layer 115 are connected, in a similar manner to the way in which the fourth contact conductive layer 150 configuring the second contact section 201 is connected to the first capacitor conductive layer 114.

However, the shape of the capacitance device 101 in the semiconductor device of FIG. 15 differs from that of the capacitance device 100 of the semiconductor device shown in FIGS. 1 to 3. As shown in FIG. 15, the capacitance device 101 could be formed to have any desired shape and dimensions.

A second capacitor conductive layer 118 configuring the capacitance device 101 has the shape of a side wall, in a similar manner to the second capacitor conductive layer 116 configuring the capacitance device 100 of the semiconductor device shown in FIGS. 1 to 3. In addition, one capacitance device 101 comprises two of the second capacitor conductive layers 118, with the configuration being such that these second capacitor conductive layers 118 are connected to the first contact conductive layer 232 configuring the first contact section 240 and the fifth contact conductive layer 132 configuring the second contact section 241, to form a loop-shaped structure. Each second capacitor conductive layer 118 could also be formed to have a similar cross-sectional shape as that of the first and second control gates 20 and 30 configuring the memory cell 102. In this case, it would be possible to set the capacitance to a predetermined value by setting the sectional area and length of the second capacitor conductive layer 118 to predetermined values.

To obtain the capacitance device 101 of the shape shown in FIG. 15, aperture portions 360 such as those shown in FIG. 16 are formed during the process of fabricating the semiconductor device of this embodiment as shown in FIG. 6. For the remaining steps, the capacitance device 101 can be formed by using a method similar to that of the previously described semiconductor device fabrication method of this embodiment.

The present invention was described above with reference to one embodiment thereof but the present invention is not limited thereto and thus it can be embodied in various ways within the scope of the invention laid out herein. For example, in the above described embodiment, a semiconductor substrate in bulk form is used as the semiconductor layer, but a semiconductor layer of an SOI substrate could be used instead.

What is claimed is:

1. A semiconductor device comprising an isolation region formed in a semiconductor layer and a capacitance device formed above the isolation region, and a first contact section connected to the capacitance device, wherein the capacitance device includes:

a first capacitor conductive layer disposed above the isolation region; and a second capacitor conductive layer formed along one side surface of the first capacitor conductive layer, wherein the second capacitor conductive layer having a first sidewall adjacent the first capacitor conductive layer and a second sidewall opposite to the first sidewall, wherein the second sidewall is a curved surface;

wherein the second capacitor conductive layer is disposed facing the first capacitor conductive layer, with a first capacitor insulating layer interposed, wherein the first contact section includes:

a first contact conductive layer connected to the second capacitor conductive layer, the first contact conductive layer not provided above the curved surface of the second capacitor conductive layer.

2. The semiconductor device as defined in claim 1, wherein the first capacitor insulating layer is formed between the first and second capacitor conductive layers.

3. The semiconductor device as defined in claim 1, wherein the first capacitor conductive layer is disposed above the isolation region with a third capacitor insulating layer interposed.

4. The semiconductor device as defined in claim 1, wherein the first capacitor insulating layer is formed of a stack of a first silicon oxide layer, a silicon nitride layer, and a second silicon oxide layer.

5. The semiconductor device as defined in claim 1, wherein the second capacitor conductive layer is covered by an insulating layer.

6. The semiconductor device as defined in claim 1, comprising a plurality of the capacitance devices,
wherein the first and second capacitor conductive layers in each of the capacitance devices are arranged in a first direction and also extend in a second direction.

7. The semiconductor device as defined in claim 1, comprising a plurality of the second capacitor conductive layers,
wherein the capacitance device includes two of the second capacitor conductive layers; and
wherein the first contact section is connected to the two of the second capacitor conductive layers.

8. The semiconductor device as defined in claim 1, wherein the second capacitor conductive layer is disposed facing the isolation region, with a second capacitor insulating layer interposed.

9. The semiconductor device as defined in claim 8, wherein the second capacitor insulating layer is formed of a stack of a first silicon oxide layer, a silicon nitride layer, and a second silicon oxide layer.

10. The semiconductor device as defined in claim 1, wherein a contact region formed of a doped layer is further provided in the semiconductor layer; and
wherein the contact region is disposed around the isolation region.

11. The semiconductor device as defined in claim 10, wherein the contact region is connected to a reference power voltage.

12. The semiconductor device as defined in claim 1, wherein the first contact section includes a first contact conductive layer and a pad-shaped second contact conductive layer disposed above the first contact conductive layer.

13. The semiconductor device as defined in claim 12, comprising a plurality of the capacitance devices and a plurality of first contact sections,
wherein the capacitance devices are respectively connected to the first contact sections; and
wherein the plurality of the capacitance devices are connected to the second contact conductive layer.

14. The semiconductor device as defined in claim 12, further comprising a second contact section connected to the capacitance device,
wherein the second contact section includes a fourth contact conductive layer and a fifth contact conductive layer;
wherein the fourth contact conductive layer is connected to the first capacitor conductive layer; and
wherein the fifth contact conductive layer is connected to the second capacitor conductive layer.

15. The semiconductor device as defined in claim 14, wherein the fourth contact conductive layer is formed above the first capacitor conductive layer.

16. The semiconductor device as defined in claim 14, wherein the fourth contact conductive layer is formed of the same material as the second contact conductive layer.

17. The semiconductor device as defined in claim 14, comprising a plurality of the second capacitor conductive layers,
wherein the capacitance device includes two of the second capacitor conductive layers; and
wherein the two of the second capacitor conductive layers are connected to each other by the first contact conductive layer on one end and by the fifth contact conductive layer on the other end, to form a looped structure.

18. The semiconductor device as defined in claim 1, further comprising a memory cell array in which non-volatile memory cells are arranged in a matrix of rows and columns,
wherein each of the non-volatile memory cells includes:
a word gate provided above the semiconductor layer with a first gate insulating layer interposed;
an impurity layer formed in the semiconductor layer, to configure a source region or drain region; and
first and second control gates provided along one side surface and another side surface of the word gate, respectively;
wherein the first control gate is disposed facing the semiconductor layer with a second gate insulating layer interposed, and also facing the word gate with a second side insulating layer interposed; and
wherein the second control gate is disposed facing the semiconductor layer with the second gate insulating layer interposed, and also facing the word gate with the second side insulating layer interposed.

19. The semiconductor device as defined in claim 18, wherein the first and second control gates have the same shape as the second capacitor conductive layer, and are also formed of the same material as the second capacitor conductive layer.

20. The semiconductor device as defined in claim 18, wherein the word gate is formed of the same material as the first capacitor conductive layer.

21. The semiconductor device as defined in claim 18, wherein the second capacitor conductive layer is disposed facing the isolation region, with a second capacitor insulating layer interposed; and
wherein the second gate insulating layer and the second side insulating layer are formed of the same material as the first capacitor insulating layer and the second capacitor insulating layer.

22. The semiconductor device as defined in claim 18, further comprising:
   a first contact section connected to the capacitance device, wherein the first contact section has a first contact conductive layer and a pad-shaped second contact conductive layer disposed above the first contact conductive layer; and
   a word line connected to the word gate, wherein the word line is formed of the same material as the second contact conductive layer.

23. The semiconductor device as defined in claim 22, further comprising a second contact section connected to the capacitance device,
   wherein the second contact section has a fourth contact conductive layer which is connected to the first capacitor conductive layer and a fifth contact conductive layer which is connected to the second capacitor conductive layer; and
   wherein the word line is formed of the same material as the fourth contact conductive layer.

24. The semiconductor device as defined in claim 22, wherein:
   the first contact section further has a third contact conductive layer;
   the first contact conductive layer is disposed on an inner side of the third contact conductive layer, with a first side insulating layer interposed; and
   the word gate is formed of the same material as the third contact conductive layer.

25. A semiconductor device comprising an isolation region formed in a semiconductor layer and a capacitance device formed above the isolation region, and a first contact section connected to the capacitance device,
   wherein the capacitance device includes:
   a first capacitor conductive layer disposed above the isolation region; and
   a second capacitor conductive layer, formed along one side surface of the first capacitor conductive layer, wherein the second capacitor conductive layer having a first sidewall adjacent the first capacitor conductive layer and a second sidewall opposite to the first sidewall, wherein the second sidewall is a curved surface;
   wherein the second capacitor conductive layer is disposed facing the first capacitor conductive layer, with a first capacitor insulating layer interposed;
   wherein the first contact section includes a first contact conductive layer connected to the second capacitor conductive layer, and a pad-shaped second contact conductive layer disposed above the first contact conductive layer;
   wherein the first contact conductive layer has a depression, and an insulating layer is embedded within the depression.

26. The semiconductor device as defined in claim 25,
   wherein the first contact section further includes a third contact conductive layer; and
   wherein the first contact conductive layer is disposed on an inner side of the third contact conductive layer, with a first side insulating layer interposed.

27. A semiconductor device comprising an isolation region formed in a semiconductor layer and a capacitance device formed above the isolation region, a first contact section connected to the capacitance device, and a second contact section connected to the capacitance device;
   wherein the capacitance device includes:
   a first capacitor conductive layer disposed above the isolation region; and
   a second capacitor conductive layer, formed along one side surface of the first capacitor conductive layer, wherein the second capacitor conductive layer having a first sidewall adjacent the first capacitor conductive layer and a second sidewall opposite to the first sidewall, wherein the second sidewall is a curved surface;
   wherein the second capacitor conductive layer is disposed facing the first capacitor conductive layer, with a first capacitor insulating layer interposed;
   wherein the first contact section includes a first contact conductive layer connected to the second capacitor conductive layer;
   wherein the second contact section includes a fourth contact conductive layer and a fifth contact conductive layer;
   wherein the fourth contact conductive layer is connected to the first capacitor conductive layer; and
   wherein the fifth contact conductive layer is connected to the second capacitor conductive layer.

28. The semiconductor device as defined in claim 27,
   wherein the fourth contact conductive layer is formed above the first capacitor conductive layer.

29. The semiconductor device as defined in claim 27, comprising a plurality of the capacitance devices and a plurality of the second contact sections,
   wherein the capacitance devices are respectively connected to the second contact sections; and
   wherein the plurality of the capacitance devices are connected to the fourth contact conductive layer.

* * * * *